(12) United States Patent
Song et al.

(10) Patent No.: US 12,336,171 B2
(45) Date of Patent: Jun. 17, 2025

(54) SEMICONDUCTOR MEMORY DEVICE AND METHOD OF MANUFACTURING THE SAME

(71) Applicant: Samsung Electronics Co., Ltd., Suwon-si (KR)

(72) Inventors: Hoju Song, Seongnam-si (KR); Seokhyun Kim, Incheon (KR); Youngjun Kim, Hwaseong-si (KR); Jinhyung Park, Bucheon-si (KR); Hyeran Lee, Hwaseong-si (KR); Bongsoo Kim, Yongin-si (KR); Sungwoo Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 212 days.

(21) Appl. No.: 17/512,031

(22) Filed: Oct. 27, 2021

(65) Prior Publication Data

US 2022/0052057 A1 Feb. 17, 2022

Related U.S. Application Data

(63) Continuation of application No. 16/826,655, filed on Mar. 23, 2020, now Pat. No. 11,183,500.

(30) Foreign Application Priority Data

Jul. 29, 2019 (KR) ........................ 10-2019-0092003

(51) Int. Cl.
H10B 12/00 (2023.01)

(52) U.S. Cl.
CPC ....... *H10B 12/485* (2023.02); *H10B 12/0335* (2023.02); *H10B 12/053* (2023.02); *H10B 12/315* (2023.02); *H10B 12/34* (2023.02)

(58) Field of Classification Search
None
See application file for complete search history.

(56) References Cited

U.S. PATENT DOCUMENTS

| 9,431,324 B2 | 8/2016 | Shin |
| 9,530,729 B2 | 12/2016 | Choi et al. |

(Continued)

FOREIGN PATENT DOCUMENTS

| KR | 10-2015-0045782 A | 4/2015 |
| KR | 1020150055469 A | 5/2015 |

(Continued)

OTHER PUBLICATIONS

Office Action issued Jul. 22, 2024 by the Korean Intellectual Property Office for corresponding KR Patent Application No. 10-2019-0092003.

*Primary Examiner* — Steven M Page
(74) *Attorney, Agent, or Firm* — Muir Patent Law, PLLC

(57) ABSTRACT

A method of manufacturing a semiconductor memory device includes forming bit line structures extending in a first horizontal direction on a substrate, and insulating spacer structures covering opposite sidewalls of each bit line structure, forming a preliminary buried contact material layer and a mold layer to respectively fill lower and upper portions of a space between a pair of insulating spacer structures, patterning the mold layer and the preliminary buried contact material layer into mold patterns spaced apart from each other in a second horizontal direction and buried contacts spaced apart from each other in the second horizontal direction, forming insulating fences among the mold patterns separated from each other and among the buried contacts separated from each other, removing the mold patterns to expose the buried contacts, and forming landing pads on the exposed buried contacts, each landing pad (Continued)

connected to a corresponding one of the exposed buried contacts.

20 Claims, 24 Drawing Sheets

(56) References Cited

U.S. PATENT DOCUMENTS

| | | |
|---|---|---|
| 9,953,981 B2 | 4/2018 | Kim et al. |
| 10,062,700 B2 | 8/2018 | Chang et al. |
| 10,373,960 B2 | 8/2019 | Kim et al. |
| 2016/0322362 A1* | 11/2016 | Kim .................... H10B 12/053 |
| 2017/0154805 A1 | 6/2017 | Kim et al. |
| 2017/0271340 A1 | 9/2017 | Kim et al. |
| 2018/0019244 A1 | 1/2018 | Kim et al. |
| 2019/0103302 A1* | 4/2019 | Yoon .................... H10B 12/482 |

FOREIGN PATENT DOCUMENTS

| | | |
|---|---|---|
| KR | 10-2018-0112898 A | 4/2017 |
| KR | 10-2017-0062098 B1 | 6/2017 |
| KR | 1020180005466 A | 1/2018 |
| KR | 1020190034023 A | 4/2019 |
| KR | 1020190044320 A | 4/2019 |

* cited by examiner

SEMICONDUCTOR MEMORY DEVICE AND METHOD OF MANUFACTURING THE SAME

CROSS-REFERENCE TO RELATED APPLICATION

This application is a continuation application of U.S. application Ser. No. 16/826,655 which claims the benefit of Korean Patent Application No. 10-2019-0092003, filed on Jul. 29, 2019, in the Korean Intellectual Property Office, the disclosure of each of which is incorporated herein in its entirety by reference.

BACKGROUND

The inventive concept relates to a semiconductor memory device and a method of manufacturing the same, and more particularly, to a semiconductor memory device including an insulating fence between contact structures and a method of manufacturing the semiconductor memory device.

In accordance with the rapid development of the electronics industry and user demand, electronic devices have become more compact and lightweight. Accordingly, a high degree of integration is required for semiconductor memory devices used in electronic devices, and design rules for configurations of semiconductor memory devices are reduced. Highly scaled-down semiconductor memory devices are desirable to ensure electrical reliability of contact structures that connect between active regions and capacitors.

SUMMARY

The inventive concept provides a semiconductor memory device including contact structures having improved electrical reliability and a manufacturing method of the semiconductor memory device.

According to an exemplary embodiment of the present invention, a method of manufacturing a semiconductor memory device includes forming a plurality of bit line structures extending in parallel with each other in a first horizontal direction on a substrate, and a plurality of insulating spacer structures covering opposite sidewalls of each of the plurality of bit line structures, forming a preliminary buried contact material layer and a mold layer to respectively fill a lower portion of a space between a pair of insulating spacer structures of the plurality of insulating spacer structures and an upper portion of the space, the pair of insulating spacer structures facing each other across the space, patterning the mold layer and the preliminary buried contact material layer into a plurality of mold patterns spaced apart from each other in a second horizontal direction different from the first horizontal direction and a plurality of buried contacts spaced apart from each other in the second horizontal direction, respectively, forming a plurality of insulating fences among the plurality of mold patterns separated from each other and among the plurality of buried contacts separated from each other, removing the plurality of mold patterns to expose the plurality of buried contacts, and forming a plurality of landing pads on the plurality of exposed buried contacts, each of the plurality of landing pads connected to a corresponding one of the plurality of exposed buried contacts.

According to an exemplary embodiment of the present invention, a method of manufacturing a semiconductor memory device includes forming, on a substrate, a plurality of bit line structures, a plurality of first insulating spacer structures each of which covers a first sidewall of a corresponding one of the plurality of bit line structures, and a plurality of second insulating spacer structures each of which covers a second sidewall, opposite the first sidewall, of the corresponding one of the plurality of bit line structures, forming a preliminary buried contact material layer and a mold layer on the substrate, wherein the preliminary buried contact material layer and the mold layer are formed in a first space between one of the plurality of first insulating spacer structures and one of the plurality of second insulating spacer structures adjacent thereto in a first horizontal direction, wherein the preliminary buried contact material layer fills a lower portion of the first space and the mold layer fills an upper portion thereof, and patterning the mold layer and the preliminary buried contact material layer into a plurality of mold patterns spaced apart from each other in a second horizontal direction different from the first horizontal direction and a plurality of buried contacts spaced apart from each other in the second horizontal direction, forming a plurality of insulating fences among the plurality of buried contacts and the plurality of mold patterns, a first insulating fence of the plurality of insulating fences having a lower portion and an upper portion, the lower portion of the first insulating fence being disposed between a pair of buried contacts, spaced apart from each other in the second horizontal direction, among a plurality of buried contacts and having a first width in the second horizontal direction, and the upper portion of the first insulating fence being disposed between a pair of mold patterns, spaced apart from each other in the second horizontal direction, among a plurality of mold patterns and having a second width in the second horizontal direction different from the first width.

According to an exemplary embodiment of the present invention, a method of manufacturing a semiconductor memory device includes preparing a substrate having a plurality of active regions defined by an element separation layer, forming a plurality of word line trenches crossing the plurality of active regions and extending in parallel with each other in a first horizontal direction, and a plurality of gate dielectric layers and a plurality of word lines to fill the plurality of word line trenches, forming a plurality of bit line structures each comprising a bit line and an insulating capping line covering the bit line on the substrate, the plurality of bit line structures extending in parallel with each other in a second horizontal direction crossing the first horizontal direction, and a plurality of insulating spacer structures covering opposite sidewalls of each of the bit line structures, forming a first preliminary buried contact material layer to fill a first space between a pair of insulating spacer structures among the plurality of insulating spacer structures, the pair of insulating spacer structures facing each other across the first space, removing an upper portion of the first preliminary buried contact material layer to form a second preliminary buried contact material layer and a second space between the pair of insulating spacer structures, forming a mold layer to fill the second space, forming a plurality of mold patterns and a plurality of buried contacts by patterning the mold layer and the second preliminary buried contact material layer respectively, forming, after removing the plurality of mold patterns, a plurality of landing pads on the plurality of buried contacts, and forming a plurality of capacitors on the plurality of landing pads. The plurality of mold patterns are separated from each other and the plurality of buried contacts are separated from each other. Each of the plurality of buried contacts is connected to a corresponding active region of the plurality of active regions. Each of the plurality of landing pads is connected to a corresponding one of the plurality of buried contacts. Each of the plurality of capacitors includes a bottom electrode connected to a corresponding landing pad of the plurality of landing pads.

According to an exemplary embodiment of the present invention, a semiconductor memory device includes a substrate having a plurality of active regions defined by an element separation layer, a plurality of bit line structures extending in parallel with each other in a first horizontal direction on the substrate and spaced apart from each other in a second horizontal direction different from the first horizontal direction, each of the plurality of bit line structures comprising a bit line an insulating capping line stacked on the bit line, a plurality of first insulating spacer structures covering first sidewalls of the plurality of bit line structures, a plurality of second insulating spacer structures covering second sidewalls of the plurality of bit line structures, a plurality of insulating fences disposed in a first space between one of the plurality of first insulating spacer structures and one of the plurality of second insulating spacer structures adjacent thereto and spaced apart from each other in the first horizontal direction, a plurality of buried contacts disposed in the first space and spaced apart from each other in the first horizontal direction, each of the plurality of buried contacts filling a lower portion of the first space and being connected to a corresponding one of the plurality of active regions, wherein each of the plurality of buried contacts and each of the plurality of insulating fences are alternately arranged in the first horizontal direction, and a plurality of landing pads spaced apart from each other in the first horizontal direction, each of the plurality of landing pads connected to a corresponding one of the plurality of buried contacts, each of the plurality of landing pads filling an upper portion of the first space and extending to an upper portion of a corresponding one of the plurality of bit line structures. Each of the plurality of insulating fences extends from between a corresponding pair of buried contacts among the plurality of buried contacts to between a corresponding pair of landing pads among the plurality of landing pads. A first width of a lower portion of each of the plurality of insulating fences between the corresponding pair of buried contacts is different from a second width of an upper portion of each of the plurality of insulating fences between the corresponding pair of landing pads. The first width and the second width are measured in the first horizontal direction.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
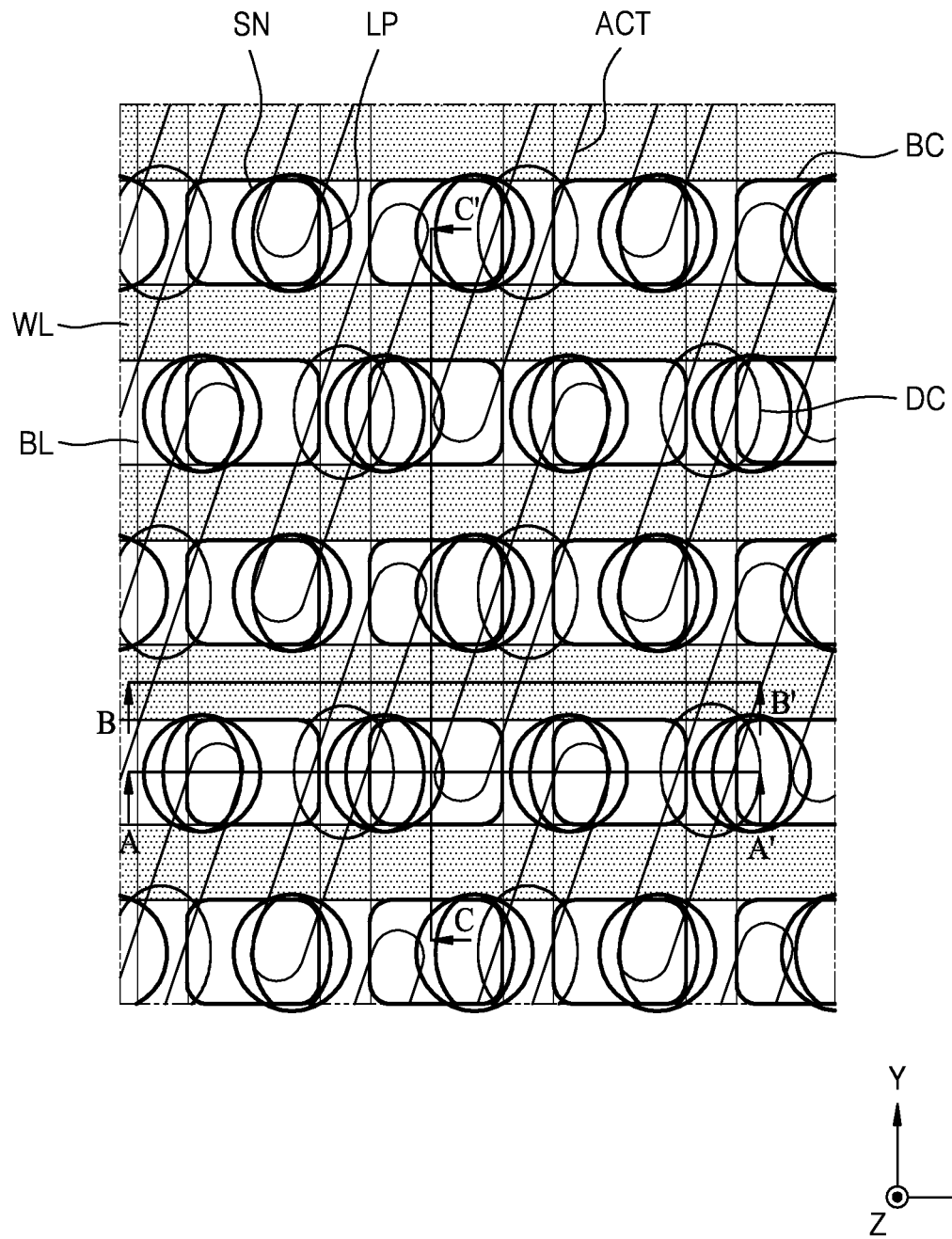
FIG. 1 is a schematic plan layout of main components of a semiconductor memory device, according to example embodiments of the inventive concept.

FIG. 1 is a schematic plan layout of a semiconductor memory device 10, according to example embodiments of the inventive concept.

Referring to FIG. 1, the semiconductor memory device 10 may include a plurality of active regions ACT. In some embodiment, the plurality of active regions ACT may have a long axis in a diagonal direction with respect to a first horizontal direction (X direction) and a second horizontal direction (Y direction).

A plurality of word lines WL may extend in parallel with each other in the first horizontal direction (X direction) across the plurality of active regions ACT. On the plurality of word lines WL, a plurality of bit lines BL may extend in parallel with each other in the second horizontal direction (Y direction) across the first horizontal direction (X direction).

The plurality of bit lines BL may be connected to the plurality of active regions ACT via direct contacts DC.

In some embodiment, a plurality of buried contacts BC may be formed between two adjacent bit lines BL among the plurality of bit lines BL. In some embodiment, the plurality of buried contacts BC may be arranged in a line in the first horizontal direction (X direction) and the second horizontal direction (Y direction), respectively.

A plurality of landing pads LP may be formed on the plurality of buried contacts BC. The plurality of landing pads LP may at least partially overlap the plurality of buried contacts BC. In some embodiment, the plurality of landing pads LP may extend to a top portion of any one of the two bit lines BL adjacent to each other. For example, each of the landing pads LP may be disposed between corresponding two bit lines adjacent to each other, overlapping one of the corresponding two bit lines.

A plurality of storage nodes SN may be formed on the plurality of landing pads LP. The plurality of storage nodes SN may be formed on the plurality of bit lines BL. Each of the plurality of storage nodes SN may be a bottom electrode of each of the plurality of capacitors. The storage node SN may be connected to the active region ACT via the landing pad LP and the buried contact BC.

Each of FIGS. 2 through 24 illustrates cross-section views taken along lines A-A', B-B', and C-C' in FIG. 1.

FIGS. 2 through 12 are cross-sectional views sequentially illustrating a manufacturing method of the semiconductor memory device 10, according to embodiments of the inventive concept.

Figure 2:
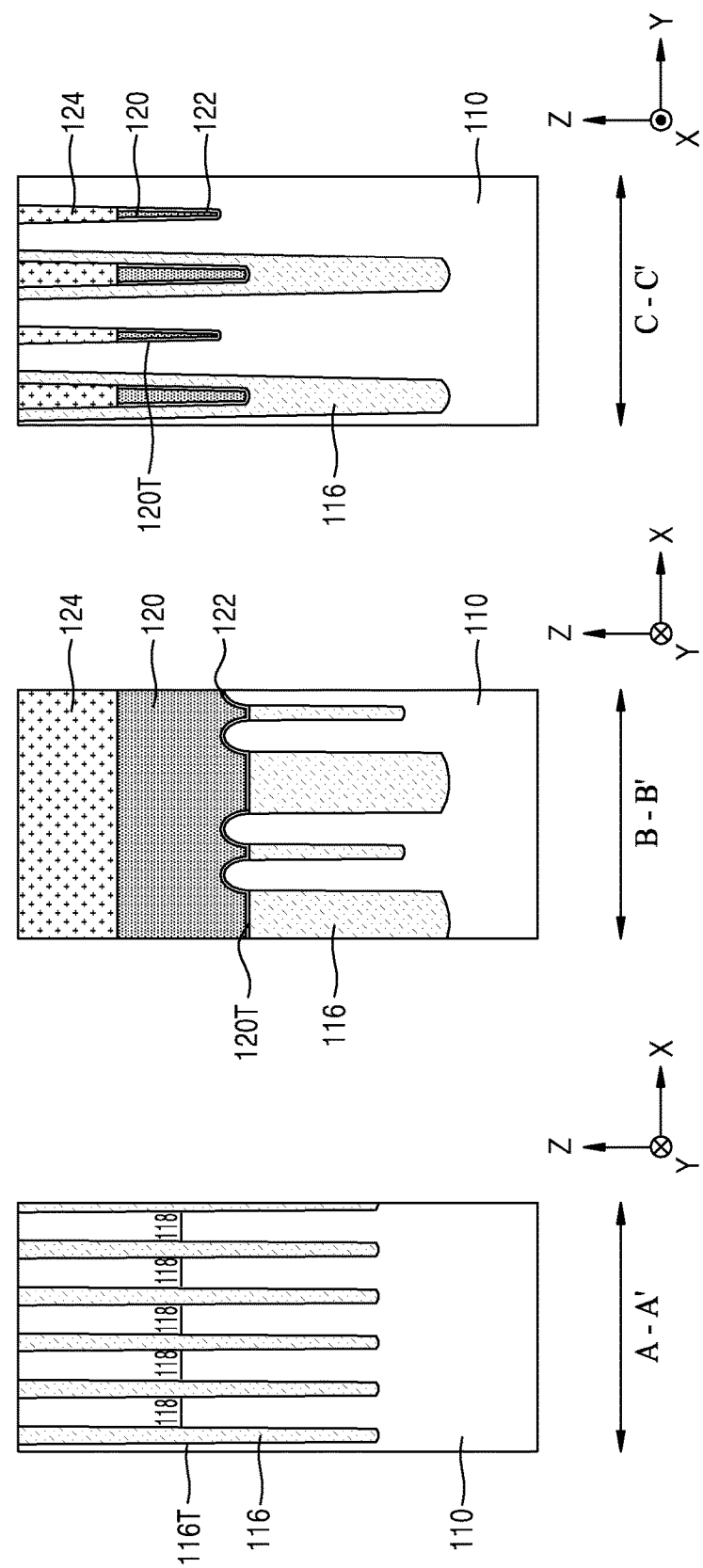
FIGS. 2 through 12 are cross-sectional views sequentially illustrating a method of manufacturing a semiconductor memory device, according to embodiments of the inventive concept.

Referring to FIG. 2, an element isolation trench 116T may be formed in a substrate 110, and an element isolation layer 116 may be formed to fill the element isolation trench 116T. A plurality of active regions 118 may be defined in the substrate 110 by the element isolation layer 116. The active region 118 may have a relatively long island shape having a short axis and a long axis, like the active region ACT illustrated in FIG. 1.

The substrate 110 may include silicon (Si) such as crystalline Si, polycrystalline Si, or amorphous Si. Alternatively, the substrate 110 may include at least one compound semiconductor of a semiconductor element such as germanium (Ge), silicon germanium (SiGe), silicon carbide (SiC), gallium arsenide (GaAs), indium arsenide (InAs), and indium phosphide (InP). Alternatively, the substrate 110 may have a silicon on insulator (SOI) structure. For example, the substrate 110 may include a buried oxide (BOX) layer. The substrate 110 may include a conductive region, for example, a well doped with impurities, or a structure doped with impurities.

The element isolation layer 116 may include a material including at least one of, for example, a silicon oxide layer, a silicon nitride layer, and a silicon oxynitride layer. The element isolation layer 116 may include a single layer including one kind of an insulating layer, a double layer including two kinds of insulating layers, or a multiple layer including a combination of at least three kinds of insulating layers. For example, the element isolation layer 116 may include a double layer or a multiple layer of an oxide layer and a nitride layer. However, according to the technical idea of the inventive concept, a configuration of the element isolation layer 116 is not limited thereto.

A plurality of word line trenches 120T may be formed in the substrate 110. The plurality of word line trenches 120T may extend in parallel with each other in the first horizontal direction (X direction), and may have a line shape in which each of the plurality of word line trenches 120T is arranged to cross the active region 118 and the plurality of word line trenches 120T have substantially equal intervals therebetween in the second horizontal direction (Y direction). As illustrated in the cross-sectional view of the line B-B', a step may be formed on a bottom surface of each of the plurality of word line trenches 120T. In some embodiment, in the plurality of word line trenches 120T, the element isolation layer 116 and the substrate 110 may be etched by separate etching processes such that an etching depth of the element isolation layer 116 is different from an etching depth of the substrate 110. In some embodiment, the plurality of word line trenches 120T may be etched together with the element isolation layer 116 and the substrate 110, but due to a difference in etching rates between the element isolation layer 116 and the substrate 110, the etching depth of the element separation layer 116 may be different from the etching depth of the substrate 110 and the step may be formed on the bottom surface of each of the plurality of word line trenches 120T.

After cleaning a resultant product in which the plurality of word line trenches 120T have been formed, a plurality of gate dielectric layers 122, a plurality of word lines 120, and a plurality of buried insulating layers 124 may be sequentially formed in the plurality of word line trenches 120T. The plurality of word lines 120 may constitute the plurality of word lines WL illustrated in FIG. 1.

The plurality of word lines 120 may fill lower portions inside the plurality of word line trenches 120T, and the plurality of buried insulating layers 124 may cover the plurality of word lines 120 and fill upper portions inside the plurality of word line trenches 120T. Thus, the plurality of word lines 120 may extend in parallel with each other in the first horizontal direction (X direction), and may have a line shape in which each of the plurality of word lines 120 is arranged to cross the active region 118 and the plurality of word lines 120 have substantially equal intervals therebetween in the second horizontal direction (Y direction). Likewise, the plurality of buried insulating layer 124 may extend in parallel with each other in the first horizontal direction (X direction), and may have a line shape in which each of the plurality of buried insulating layer 124 is arranged to cross the active region 118 and the plurality of buried insulating layer 124 have substantially equal intervals therebetween in the second horizontal direction (Y direction).

In some embodiment, the plurality of word lines 120 may include Ti, TiN, Ta, TaN, W, WN, TiSiN, WSiN, or a combination thereof. In some embodiments, each of the plurality of word lines 120 may include a core layer, and a barrier layer between the core layer and the gate dielectric layer 122. For example, the core layer may include a metal material such as W or a conductive metal nitride such as WN, TiSiN, and WSiN, and the barrier layer may include a metal material such as Ti and Ta or a conductive metal nitride such as TiN and TaN.

The gate dielectric layer 122 may include at least one of a silicon oxide layer, a silicon nitride layer, a silicon oxynitride layer, an oxide/nitride/oxide (ONO) layer, or a high dielectric layer having a higher dielectric constant than the silicon oxide layer. For example, the gate dielectric layer 122 may have a dielectric constant of about 10 to about 25. In some embodiments, the gate dielectric layer 122 may include at least one of hafnium oxide (HfO), hafnium silicate (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), and lead scandium tantalum oxide (PbScTaO). For example, the gate dielectric layer 122 may include $HfO_2$, $Al_2O_3$, $HfAlO_3$, $Ta_2O_3$, or $TiO_2$.

Top surfaces of the plurality of buried insulating layers 124 may be at substantially the same level as top surfaces of the substrate 110. The buried insulating layer 124 may include one material layer of a silicon oxide layer, a silicon nitride layer, a silicon oxynitride layer, and a combination thereof.

A top surface of each of the plurality of word lines 120 may be at a level lower than the top surface of the substrate 110. Bottom surfaces of the plurality of word lines 120 may have a concave-convex shape, and the plurality of active regions 118 may include saddle type fin field effect transistors (saddle type FinFET).

In the present specification, a level may denote a height with respect to a main surface of the substrate 110 in a vertical direction (Z direction). In other words, that a position is at an identical level or a constant level may denote that a position is at an identical height or a constant height with respect to the main surface of the substrate 110 in the vertical direction (Z direction), and that a position is at a lower/higher level may denote that a position is at a less/greater height with respect to the reference surface (e.g., upper surface) of the substrate 110 in the vertical direction (Z direction).

In some embodiments, after the plurality of word lines 120 are formed, impurity ions may be implanted into portions of the active regions 118 of the substrate 110 on both sides of the plurality of word lines 120, and a source region and a drain region may be formed inside the plurality of active regions 118. In some other embodiment, an impurity ion implantation process for forming the source region and the drain region may be performed before the plurality of word lines 120 are formed.

Figure 3:
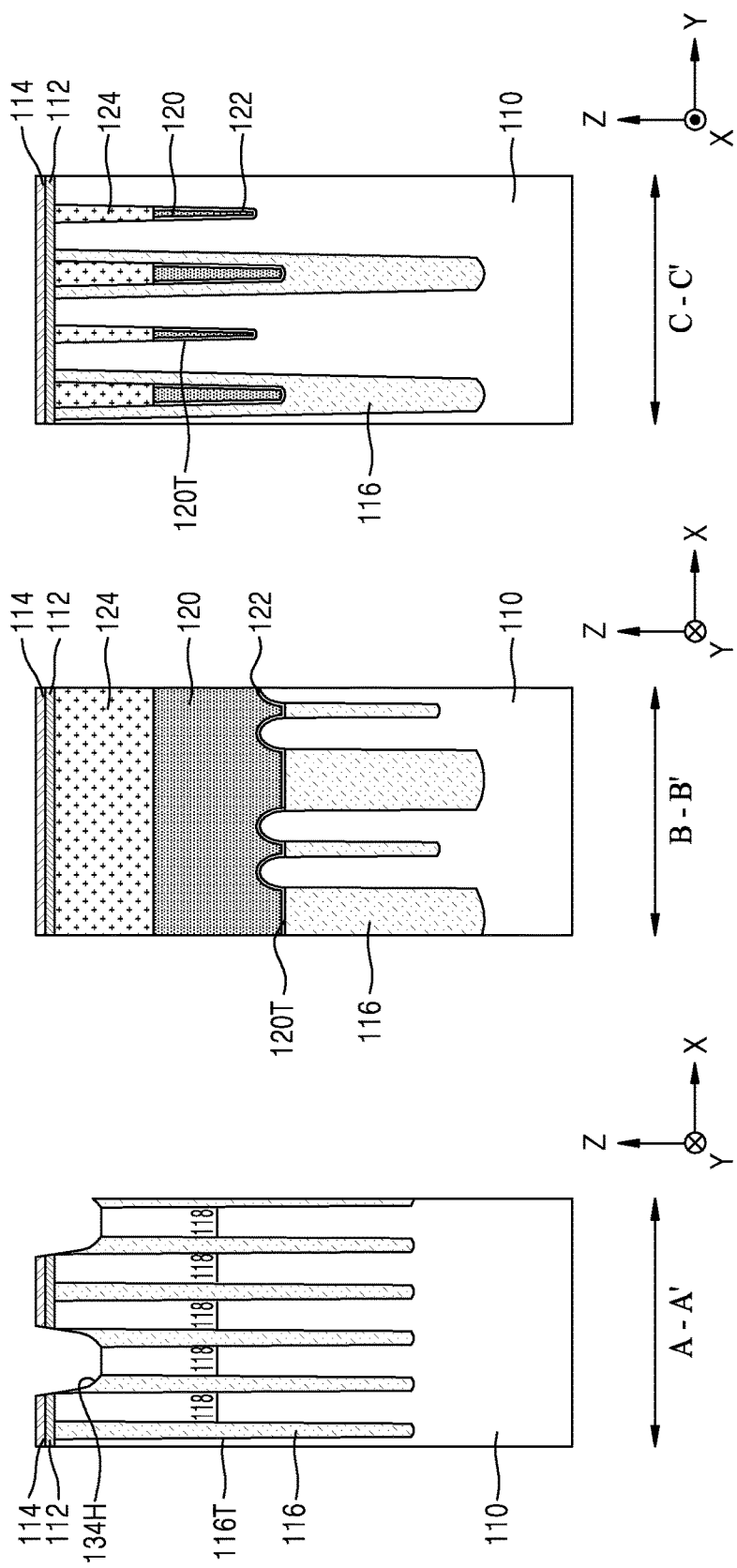

Referring to FIG. 3, insulating layer patterns (112 and 114), which cover the isolation layer 116, the plurality of active regions 118, and the plurality of buried insulating layers 124, may be formed. For example, the insulating layer patterns (112 and 114) may include a silicon oxide layer, a silicon nitride layer, a silicon oxynitride layer, or a combination thereof.

In some embodiment, the insulating layer patterns (112 and 114) may be formed by stacking a plurality of insulating layers including a first insulating layer pattern 112 and a second insulating layer pattern 114. For example, the second insulating layer pattern 114 may have a greater dielectric constant than that of the first insulating layer pattern 112.

In some embodiment, the first insulating layer pattern 112 may include a silicon oxide layer, and the second insulating layer pattern 114 may include a silicon nitride layer.

In some embodiment, the first insulating layer pattern 112 may include a non-metal dielectric layer, and the second insulating layer pattern 114 may include a metal dielectric layer. For example, the first insulating pattern 112 may include a silicon oxide layer, a silicon nitride layer, a silicon oxynitride layer, or a combination thereof. For example, the second insulating layer 114 may include at least one of hafnium oxide (HfO), hafnium silicate (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), and lead scandium tantalum oxide (PbScTaO).

Next, a direct contact hole 134H penetrating the first insulating layer pattern 112 and the second insulating layer pattern 114 may be formed. The direct contact hole 134H may be formed to expose the source region in the active region 118. In some embodiment, the direct contact hole 134H may extend into the active region 118, that is, into the source region.

Figure 4:
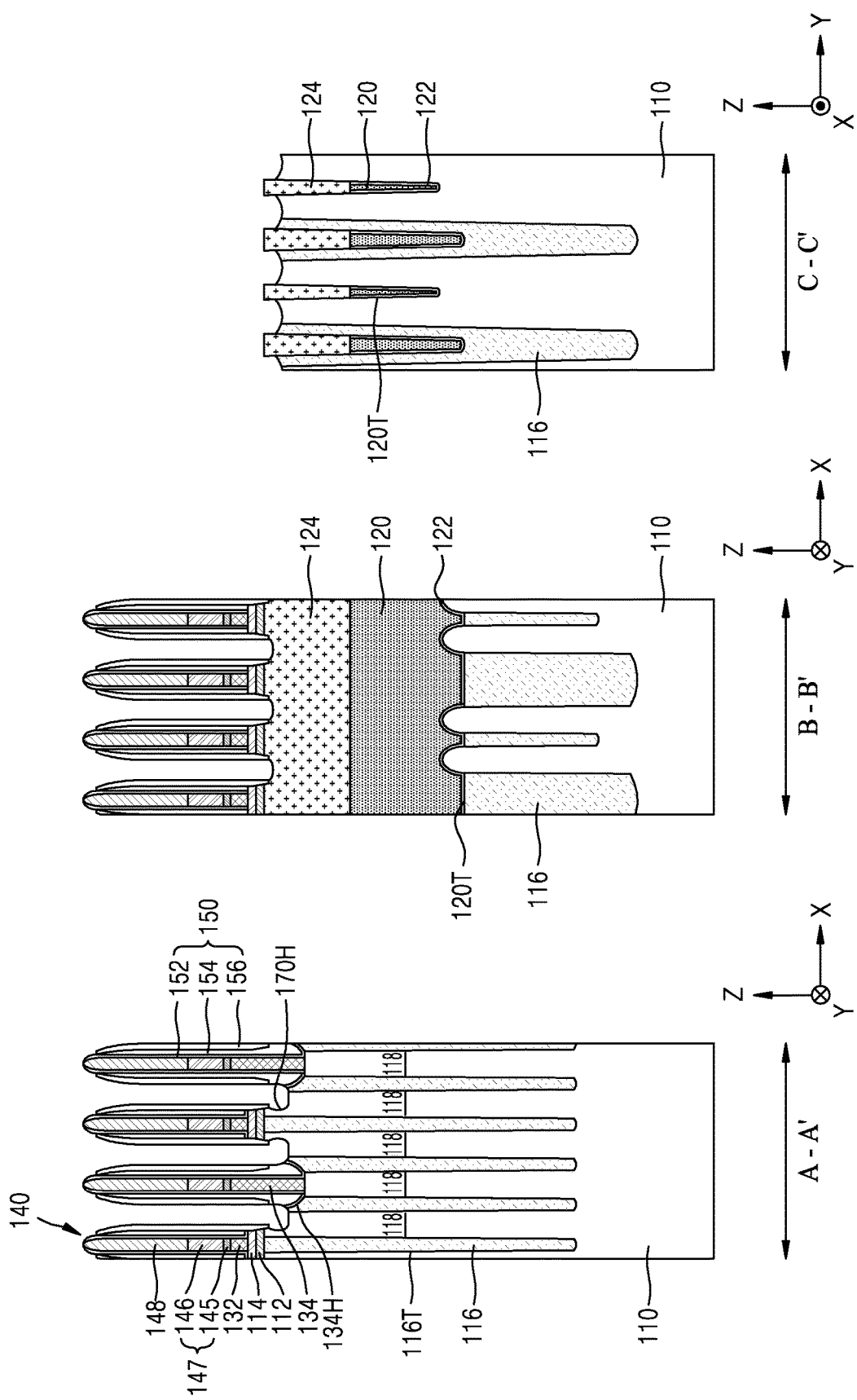

Referring to FIG. 4, a direct contact conductive layer filling the direct contact hole 134H and covering the first insulating layer pattern 112 and the second insulating layer pattern 114 may be formed. The direct contact conductive layer may include silicon (Si), germanium (Ge), tungsten (W), tungsten nitride (WN), cobalt (Co), nickel (Ni), aluminum (Al), and molybdenum (Mo), Ruthenium (Ru), titanium (Ti), titanium nitride (TiN), tantalum (Ta), tantalum nitride (TaN), copper (Cu), or a combination thereof. In some embodiment, the direct contact conductive layer may include an epitaxial silicon layer. In some embodiment, the direct contact conductive layer may include doped polysilicon.

Next, a metal-based conductive layer which covers the first insulating layer pattern 112, the second insulating layer pattern 114, and the direct contact conductive layer, forms a bit line structure 140, and an insulating capping layer may be sequentially formed.

In some embodiment, the metal-based conductive layer may have a stacked structure including a first metal-based conductive layer and a second metal-based conductive layer. The metal-based conductive layer may have a conductive layer stacked structure of a double layer structure, but this is an example, and the technical idea of the inventive concept is not limited thereto. For example, the metal-based layer may have a plurality of stacked structures of a single layer or three or more layers.

In some embodiment, the first metal-based conductive layer may include titanium nitride (TiN) or Ti-Si-N(TSN), and the second metal-based conductive layer may include W, or tungsten silicide (WSix). In some embodiment, the first metal-based conductive layer may function as a diffusion barrier. In some embodiment, the insulating capping layer may include a silicon nitride layer.

By etching the first metal-based conductive layer, the second metal-based conductive layer, and the insulating capping layer, a plurality of bit lines 147 including the first metal-based conductive pattern 145 and the second metal-based conductive pattern 146 in a line shape, and a plurality of insulating capping lines 148 may be formed. One bit line 147 and one insulating capping line 148 covering the one bit line 147 may constitute one bit line structure 140.

In some embodiment, the bit line structure 140 may further include a conductive semiconductor pattern 132 between the second insulating layer pattern 114 and the first metal-based conductive pattern 145. The conductive semiconductor pattern 132 may include doped polysilicon, for example. In some embodiment, the conductive semiconductor pattern 132 may not be formed but omitted.

Each of the plurality of bit line structures 140 including the plurality of bit lines 147 and the plurality of insulating capping lines 148 may extend in parallel with each other and in parallel with the main surface of the substrate 110 in the second horizontal direction (Y direction). The plurality of bit lines 147 may constitute the plurality of bit lines BL illustrated in FIG. 1.

In an etching process of forming the plurality of bit lines 147, the plurality of direct contact conductive pattern 134 may be formed by removing together with a portion of the direct contact conductive layer that does not vertically overlap the bit line 147. In this case, the first insulating layer pattern 112 and the second insulating layer pattern 114 may function as etch stop layers in an etching process of forming the plurality of bit lines 147 and the plurality of direct contact conductive patterns 134. The plurality of direct contact conductive patterns 134 may constitute the plurality of direct contacts DC illustrated in FIG. 1. The plurality of bit lines 147 may be electrically connected to the plurality of active regions 118 via the plurality of direct contact conductive patterns 134.

In some embodiment, the conductive semiconductor pattern 132 and the direct contact conductive pattern 134 may be formed together from the direct contact conductive layer in an etching process. For example, the conductive semiconductor pattern 132 may be a portion that does not vertically overlap the direct contact hole 134H and is on the first insulating layer pattern 112 and the second insulating layer pattern 114 among the portions of the direct contact conductive layer vertically overlapping the bit line 147, and the direct contact conductive pattern 134 may be a portion that vertically overlaps the direct contact hole 134H and contact the active region 118. The term "contact," as used herein, refers to a direction connection (i.e., touching) unless the context indicates otherwise.

Both sidewalls of each of the plurality of bit line structures 140 may be covered by an insulating spacer structure 150. Each of the plurality of insulating spacer structures 150 may include a first insulating spacer 152, a second insulating spacer 154, and a third insulating spacer 156. The second insulating spacer 154 may include a material having a lower dielectric constant than that of the first insulating spacer 152 and that of the third insulating spacer 156. In some embodiment, the first insulating spacer 152 and the third insulating spacer 156 may include a nitride layer, and the second insulating spacer 154 may include an oxide layer. In some embodiment, the first insulating spacer 152 and the third insulating spacer 156 may include a nitride layer, and the second insulating spacer 154 may include a material having etching selectivity with respect to that of the first insulating spacer 152 and that of the third insulating spacer 156. For example, when the first insulating spacer 152 and the third insulating spacer 156 include a nitride layer, the second insulating spacer 154 may include an oxide layer, but may be removed in a subsequent process and be replaced with an air spacer. The term "air" as discussed herein, may refer to atmospheric air, or other gases that may be present during the manufacturing process.

A plurality of buried contact holes 170H may be formed between the plurality of bit lines 147. The plurality of buried contact holes 170H may have an inside space limited by the insulating spacer structure 150 that covers sidewalls of each of two neighboring bit lines 147 between two neighboring bit lines 147 among the plurality of bit lines 147, and by the active region 118.

The plurality of buried contact holes 170H may be formed by removing portions of the first insulating layer pattern 112 and the second insulating layer pattern 114 by using the plurality of insulating capping lines 148 and insulating spacer structures 150 that covers both sidewalls of each of the plurality of bit line structures 140 as etching masks. After performing first an anisotropic etching process of removing portions of the first insulating layer pattern 112 and the second insulating layer pattern 114 by using the plurality of insulating capping lines 148 and insulating spacer structures 150 that covers both sidewalls of each of the plurality of bit line structures 140 as etching masks, and performing an isotropic etching process of further removing other portions of the active region 118, the plurality of buried contact holes 170H may be formed to have an expanded space that has been defined by the active region 118.

Figure 5:
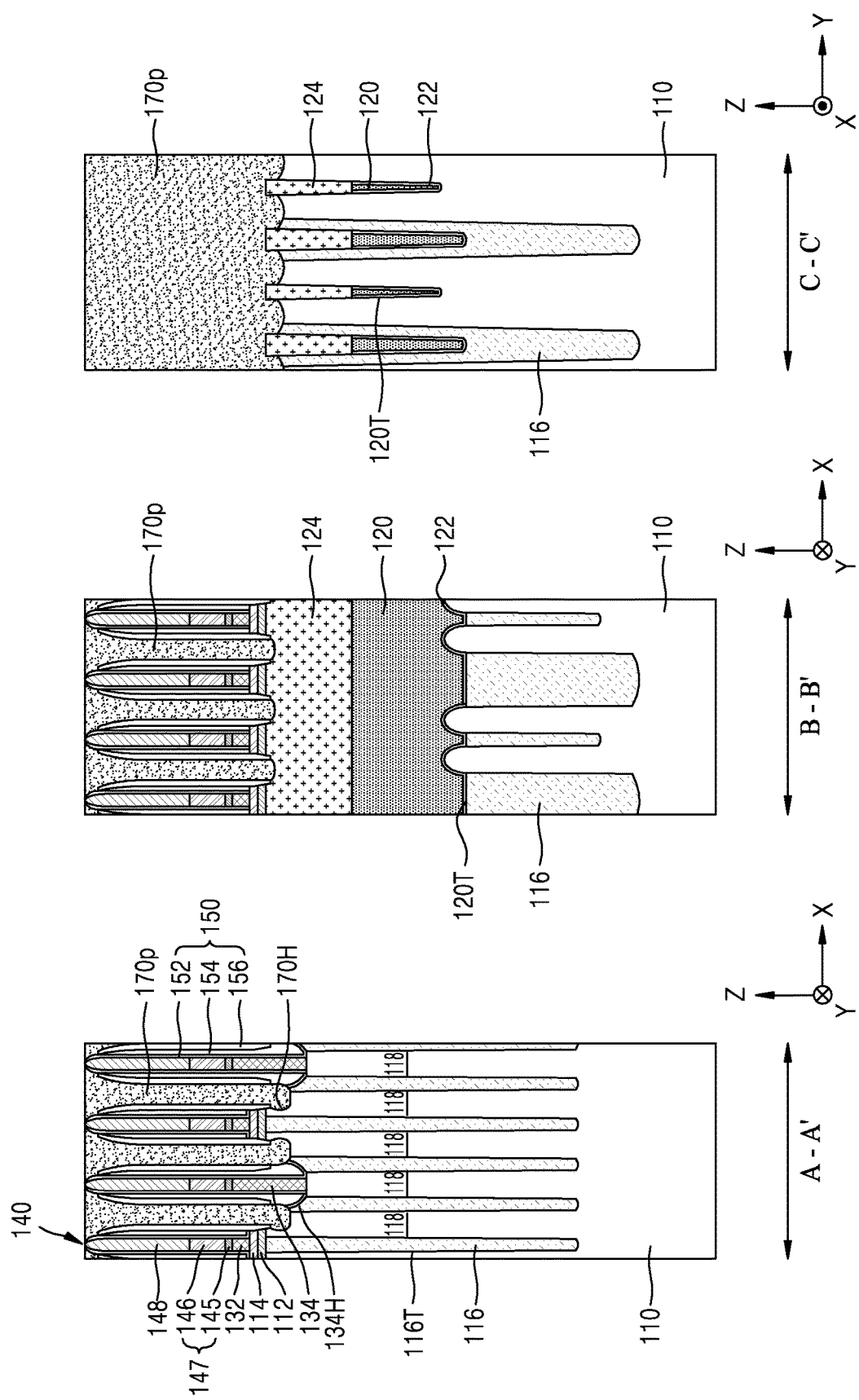

Referring to FIG. 5, a preliminary buried contact material layer 170p filling the inside of the plurality of buried contact holes 170H may be formed. For example, the preliminary buried contact material layer 170p may include polysilicon. After a conductive material layer filling the plurality of buried contact holes 170H and covering the plurality of bit line structures 140 is formed, the preliminary buried contact material layer 170p may be formed by performing a planarization process of removing a portion of the conductive material layer to expose the plurality of insulating capping lines 148. In some embodiment, a planarization process of removing a portion of the conductive material layer may be omitted, and in this case, a level of an uppermost end of the preliminary buried contact material layer 170p may be higher than a level of an uppermost end of the plurality of insulating capping lines 148.

Figure 6:
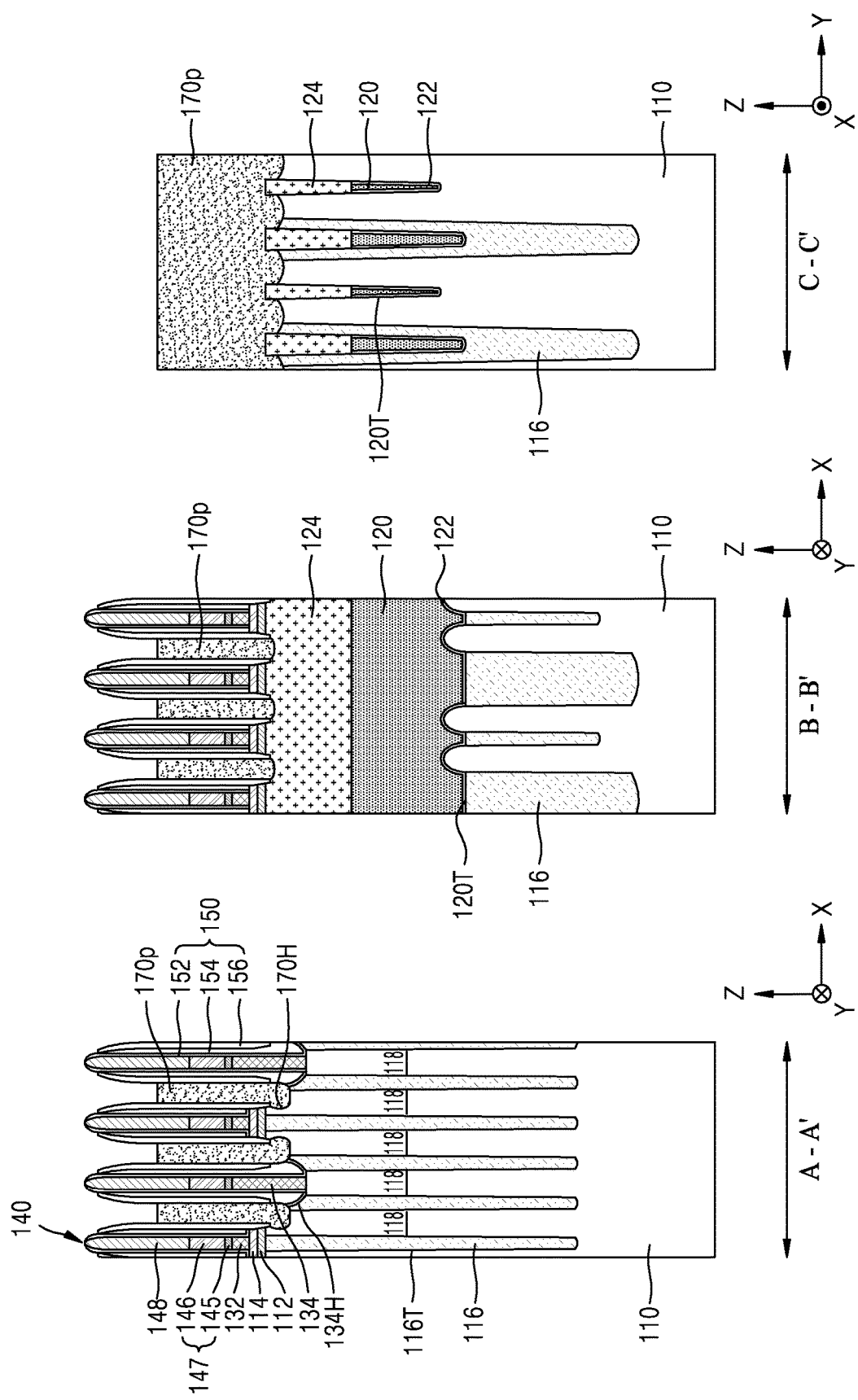

Referring to FIG. 6, by removing an upper portion of the preliminary buried contact material layer 170p such that a level of the top surface of the preliminary buried contact material layer 170p is lower than a level of the uppermost end of the plurality of insulating capping lines 148, the preliminary buried contact material layer 170p may fill a lower portion of the buried contact hole 170H. In some embodiment, the upper portion of the preliminary buried contact material layer 170p may be partially removed such that the level of the top surface of the preliminary buried contact material layer 170p is not lower than the level of the top surface of the bit line 147. However, the embodiment is not limited thereto.

In some embodiment, processes described with reference to FIGS. 5 and 6 may not be sequentially performed, but may be performed in-situ. For example, after forming the conductive material layer filling the plurality of buried contact holes 170H and covering the plurality of bit line structures 140, and removing an upper portion of the conductive material layer, the preliminary buried contact material layer 170p that fills a lower portion of the space between the plurality of insulating spacer structures 150 covering the sidewalls of each of the plurality of bit line structures 140 may be formed.

Figure 7:
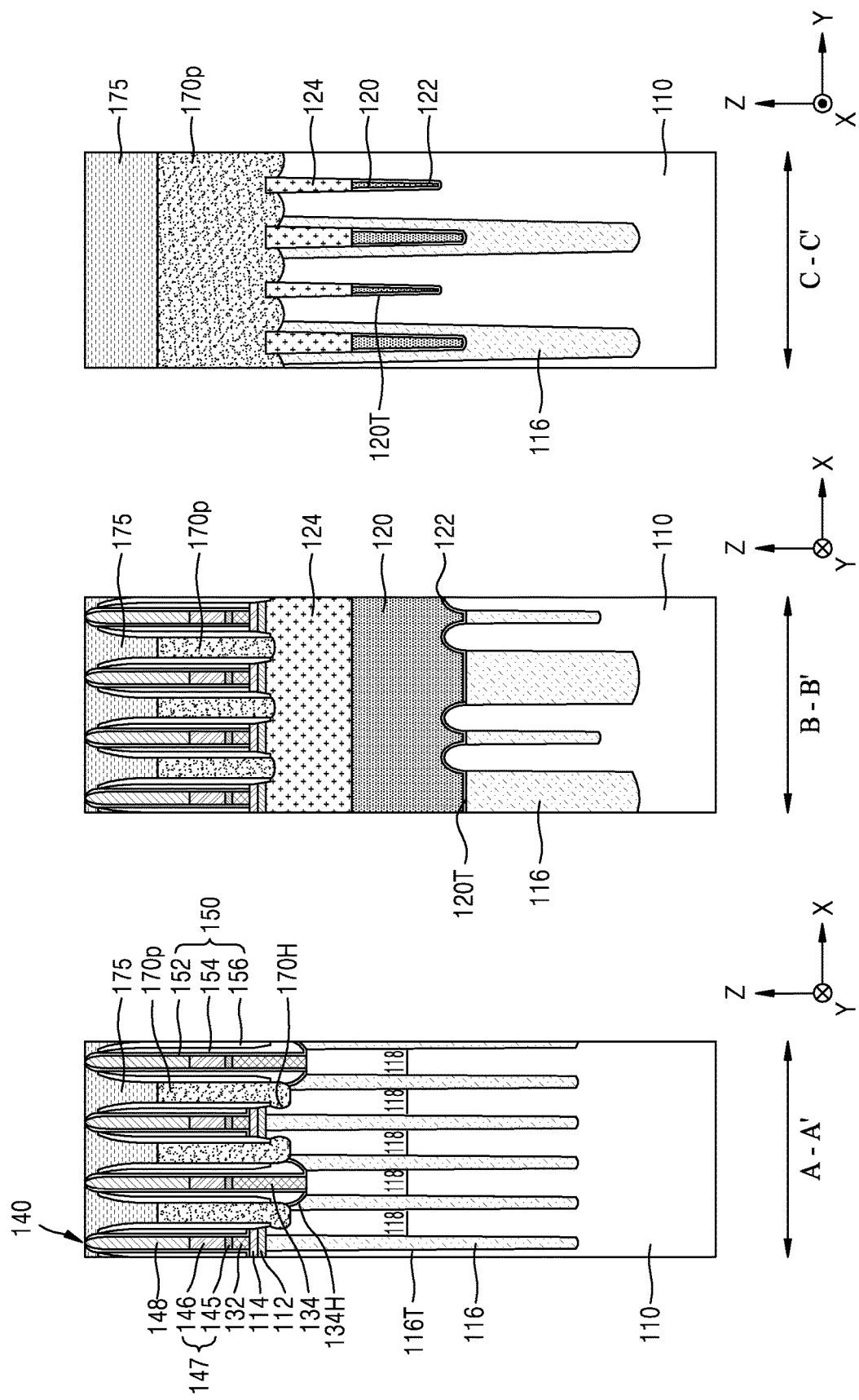

Referring to FIG. 7, a mold layer 175 that fills the removed portion of the preliminary buried contact material layer 170p described with reference to FIG. 6 may be formed. A lower portion of each of the plurality of buried contact holes 170H may be filled by the preliminary buried contact material layer 170p, and an upper portion of each of the plurality of buried contact holes 170H may be filled by the mold layer 175. In other words, a lower portion of the space between the plurality of insulating spacer structures 150 covering both sidewalls of each of the plurality of bit line structures 140 may be filled by the preliminary buried contact material layer 170p, and the upper portion of the space may be filled by the mold layer 175.

In some embodiment, the level of the top surface of the mold layer 175 may be substantially the same as the level of the uppermost end of the plurality of insulating capping lines 148. For example, the top surface of the mold layer 175 and the top surfaces of the plurality of insulating capping lines 148 may be coplanar.

The mold layer 175 may include a material having etch selectivity with respect to the insulating capping line 148, the insulating spacer structure 150, and the preliminary buried contact material layer 170p. For example, when the insulating capping line 148 and the insulating spacer structure 150 include a nitride layer, and the preliminary buried contact material layer 170p includes polysilicon, the mold layer 175 may include an oxide layer, but the embodiment is not limited thereto.

Figure 8:
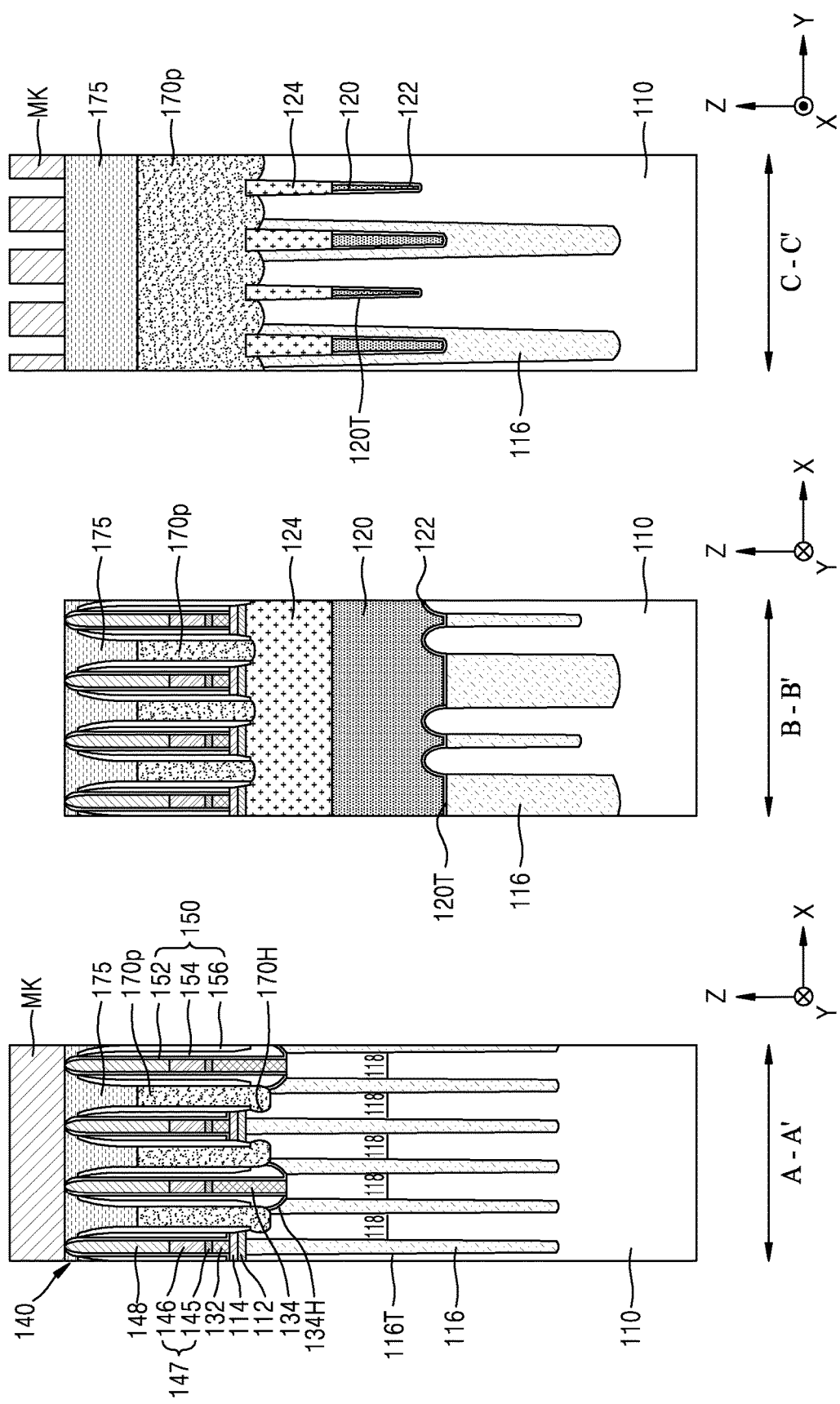

Referring to FIG. 8, a plurality of mask patterns MK may be formed on the mold layer 175. The plurality of mask patterns MK may extend in parallel with each other in the first horizontal direction (X direction). The plurality of mask patterns MK may be at locations where the plurality of mask patterns MK overlap portions between the plurality of word lines 120 in the vertical direction (Z direction). In other words, a space between a pair of adjacent mask patterns MK among the plurality of mask patterns MK may overlap one of the plurality of word lines 120 in the vertical direction (Z direction).

Figure 9:
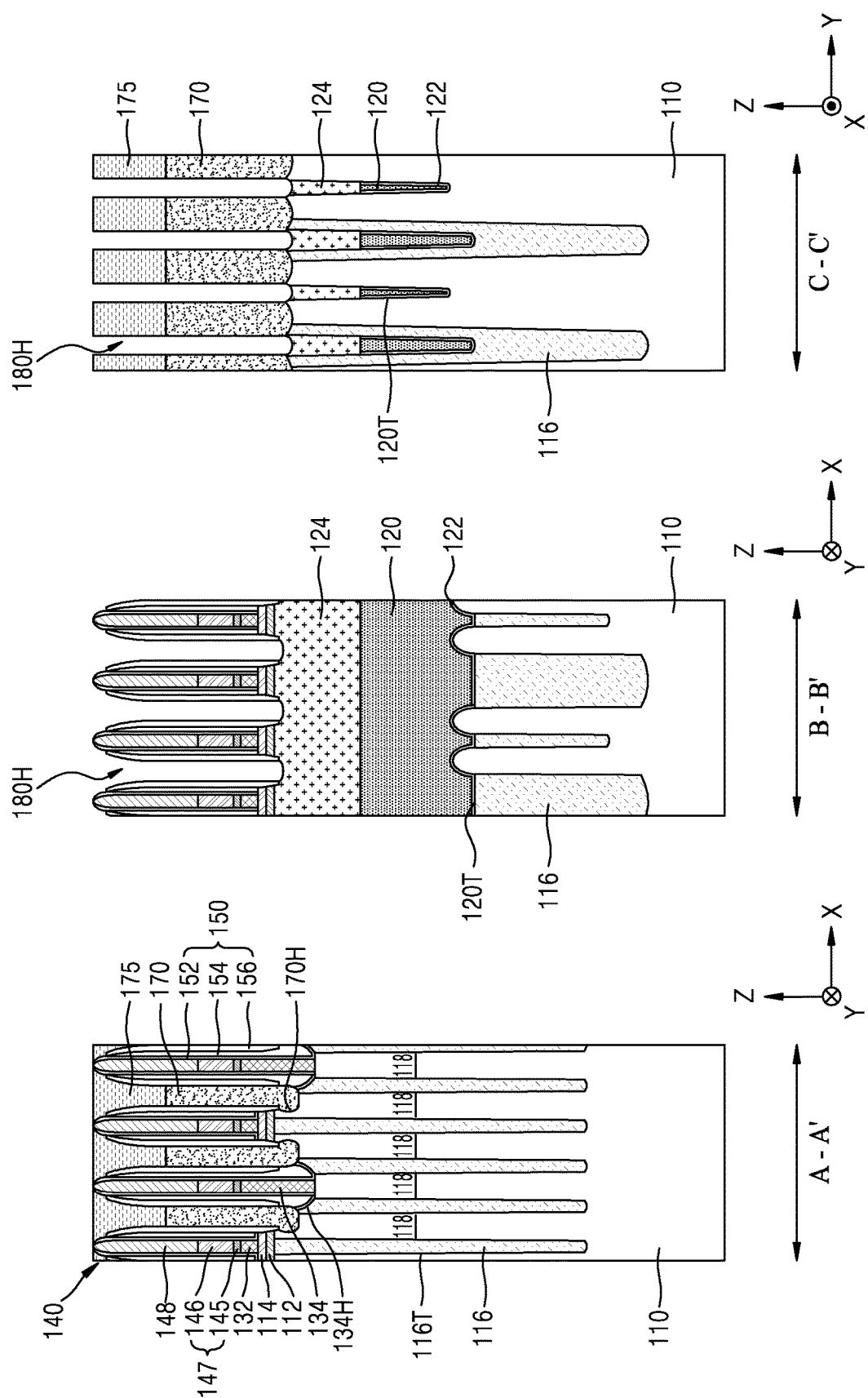

Referring to FIGS. 8 and 9, by removing a portion of the mold layer 175 and a portion of the preliminary buried contact material layer 170p by using the plurality of mask patterns MK as etching masks, a plurality of fence holes 180H causing the buried insulating layer 124 to be exposed to a bottom surface of each of the plurality of fence holes 180H may be formed. In some embodiment, the plurality of fence holes 180H may be arranged in a line in the first horizontal direction (X direction) and the second horizontal direction (Y direction), respectively.

The preliminary buried contact material layer 170p may be separated into a plurality of buried contacts 170 by the plurality of fence holes 180H. In some embodiment, the plurality of buried contacts 170 may be arranged in a line in the first horizontal direction (X direction) and the second horizontal direction (Y direction), respectively. Each of the plurality of buried contacts 170 may extend from the active region 118 in the vertical direction (Z direction in FIG. 16) perpendicular to the substrate 110. The plurality of buried contacts 170 may constitute the plurality of buried contacts BC illustrated in FIG. 1.

Similarly, the mold layer 175 may be separated into a plurality of patterns by the plurality of fence holes 180H when the plurality of buried contacts 170 are formed. In some embodiment, the plurality of mold layers 175 may be arranged in a line in the first horizontal direction (X direction) and the second horizontal direction (Y direction), respectively. Each of the plurality of mold layers 175 may extend from the buried contact 170 in the vertical direction (Z direction in FIG. 16) perpendicular to the substrate 110.

In the process of forming the plurality of fence holes 180H, the plurality of insulating capping lines 148 and the plurality of insulating spacer structures 150 together with the plurality of mask patterns MK may function as etching masks.

Although not separately illustrated, in some embodiment, in the process of forming the plurality of fence holes 180H, upper portions of the plurality of insulating capping lines 148 and/or upper portions of the plurality of insulating spacer structures 150 may be removed. In some other embodiment, in the forming process of the plurality of fence holes 180H, when the upper portions of the plurality of insulating capping lines 148 and/or upper portions of the plurality of insulating spacer structures 150 are removed, a level of an uppermost end of the second insulating spacers 154 may be lower than levels of uppermost ends of the first insulating spacer 152 and the third insulating spacer 156.

In addition, although not separately illustrated or described, the upper portions of the plurality of insulating capping lines 148 and/or the upper portions of the plurality of insulating spacer structures 150 may be further removed in a subsequent process, but a level of a top end of the plurality of insulating capping lines 148 and a level of a top end of the insulating spacer structure 150 may be maintained higher than a level of a top end of the plurality of bit lines 147.

In some embodiment, the plurality of fence holes 180H may be formed by sequentially performing a first etching process in which the preliminary buried contact material layer 170p is exposed by removing a portion of the mold layer 175 by using the plurality of mask patterns MK as etching masks, and performing a second etching process in which the exposed portion of the preliminary buried contact material layer 170p is removed.

In some embodiment, the plurality of fence holes 180H may be formed by an etching process in which a portion of the mold layer 175 and a portion of the preliminary buried contact material layer 170p are removed in-situ by using the plurality of mask patterns MK as etching masks.

Figure 10:
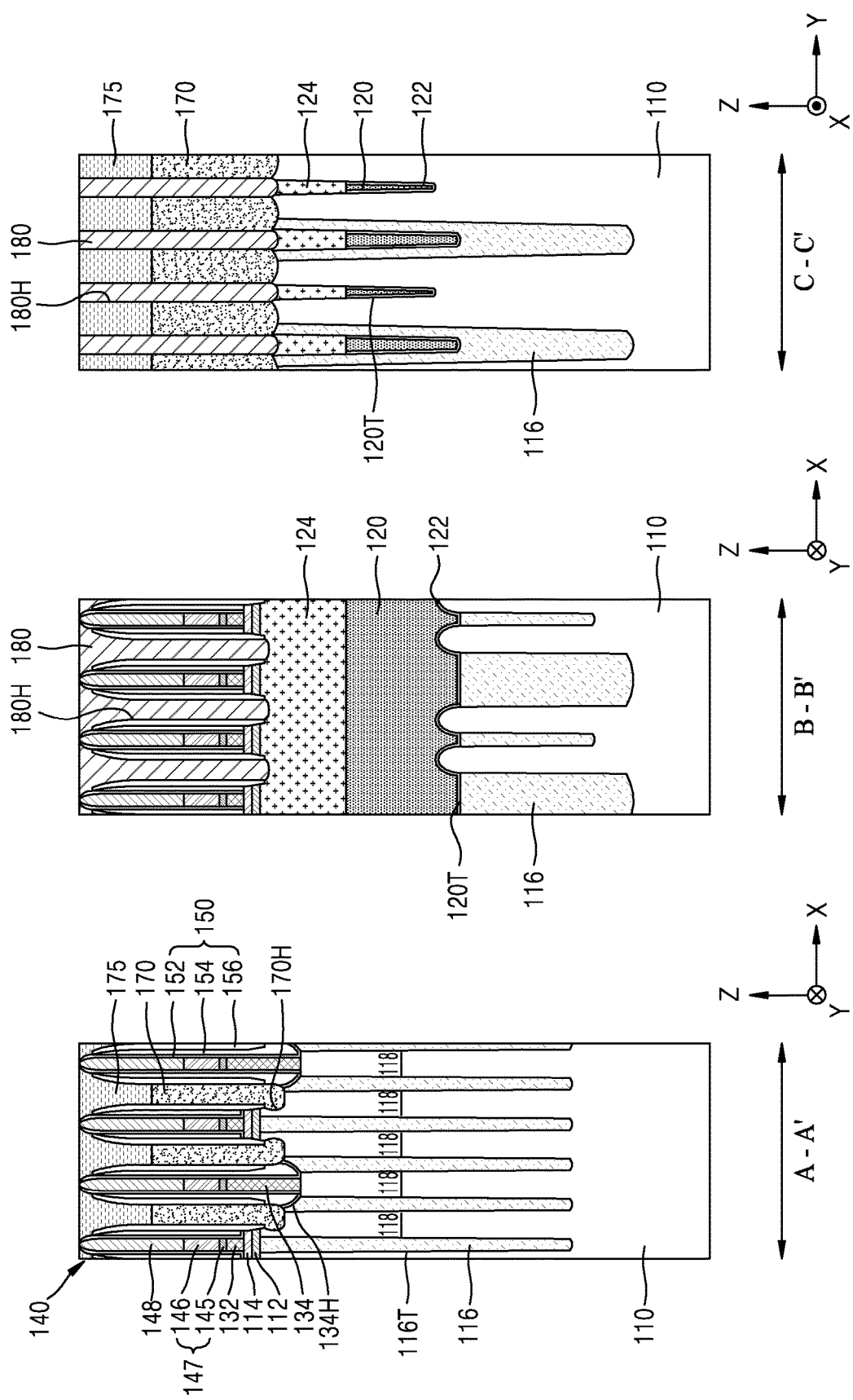

Referring to FIG. 10, a plurality of insulating fences 180 filling the plurality of fence holes 180H may be formed. The plurality of insulating fences 180 may include, for example, a nitride layer. After a fence material layer filling the plurality of fence holes 180H and covering a top surface of the mold layer 175 is formed, the plurality of insulating fences 180 may be formed by removing a portion of the fence material layer covering the top surface of the mold layer 175.

The plurality of buried contacts 170 may be in spaces defined by the plurality of insulating spacer structures 150 that cover sidewalls of the plurality of bit line structures 140, and by the plurality of insulating fences 180. In other words, the plurality of buried contacts 170 and the plurality of insulating fences 180 may be alternately arranged, in the second horizontal direction (Y direction), in the space between a pair of insulating spacer structures 150 that face each other among the plurality of insulating spacer structures 150 covering sidewalls of the plurality of bit line structures 140. For example, each of the plurality of buried contacts 170 may be disposed in a space defined by two adjacent insulating spacer structures facing each other across the space (e.g., cross-section A-A' of FIG. 10) and by two adjacent insulating fences (e.g., cross-section C-C' of FIG. 10). For example, the plurality of buried contacts 170 may be spaced apart from each other in the first horizontal direction (X direction) by the plurality of insulating spacer structures 150 and spaced apart from each other in the second horizontal direction (Y direction) by the plurality of insulating fences 180.

Figure 11:
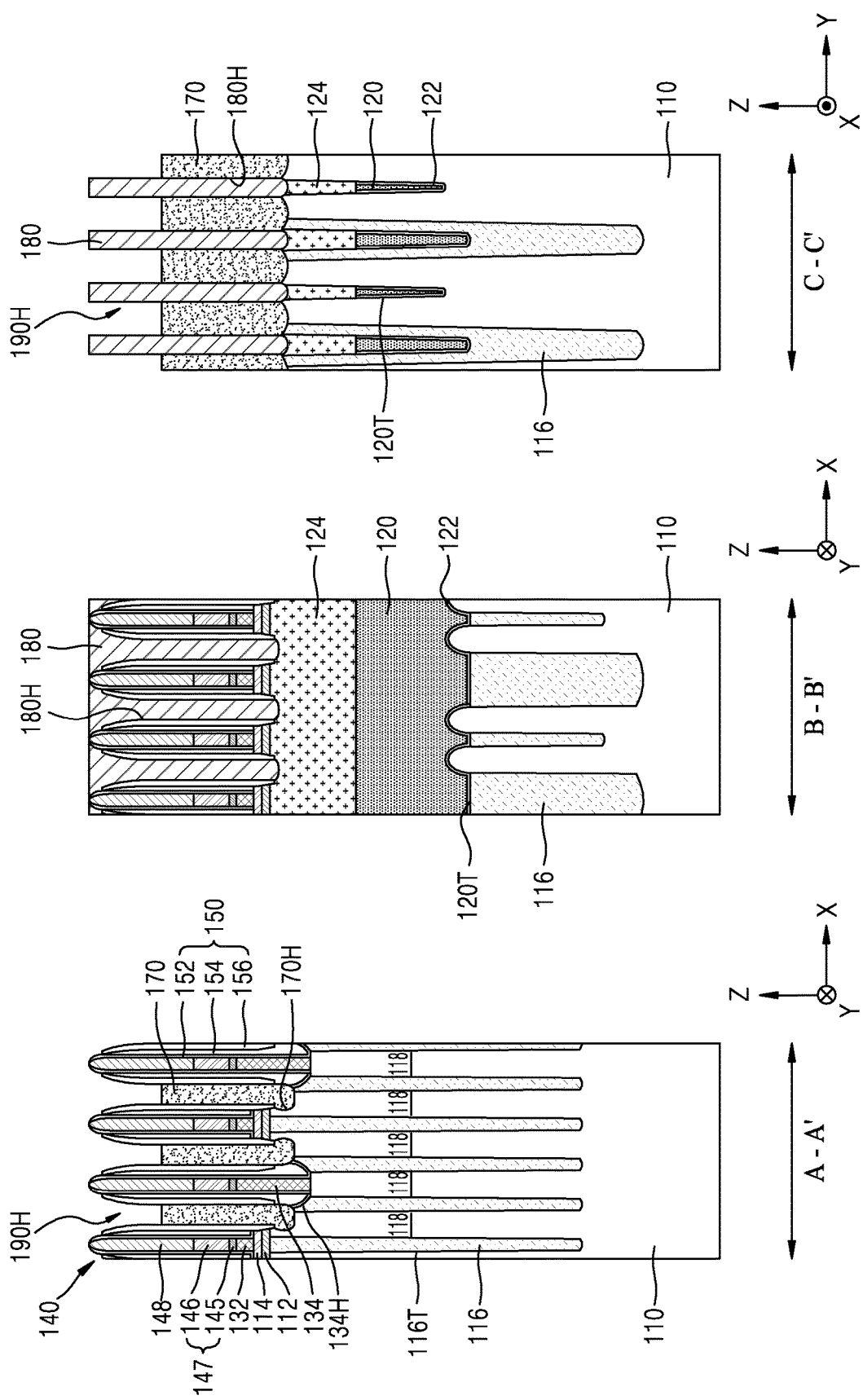

Referring to FIGS. 10 and 11 together, a plurality of landing pad holes 190H may be formed by removing the mold layer 175. The plurality of buried contacts 170 may be exposed to bottom surfaces of the plurality of landing pad holes 190H.

Figure 12:
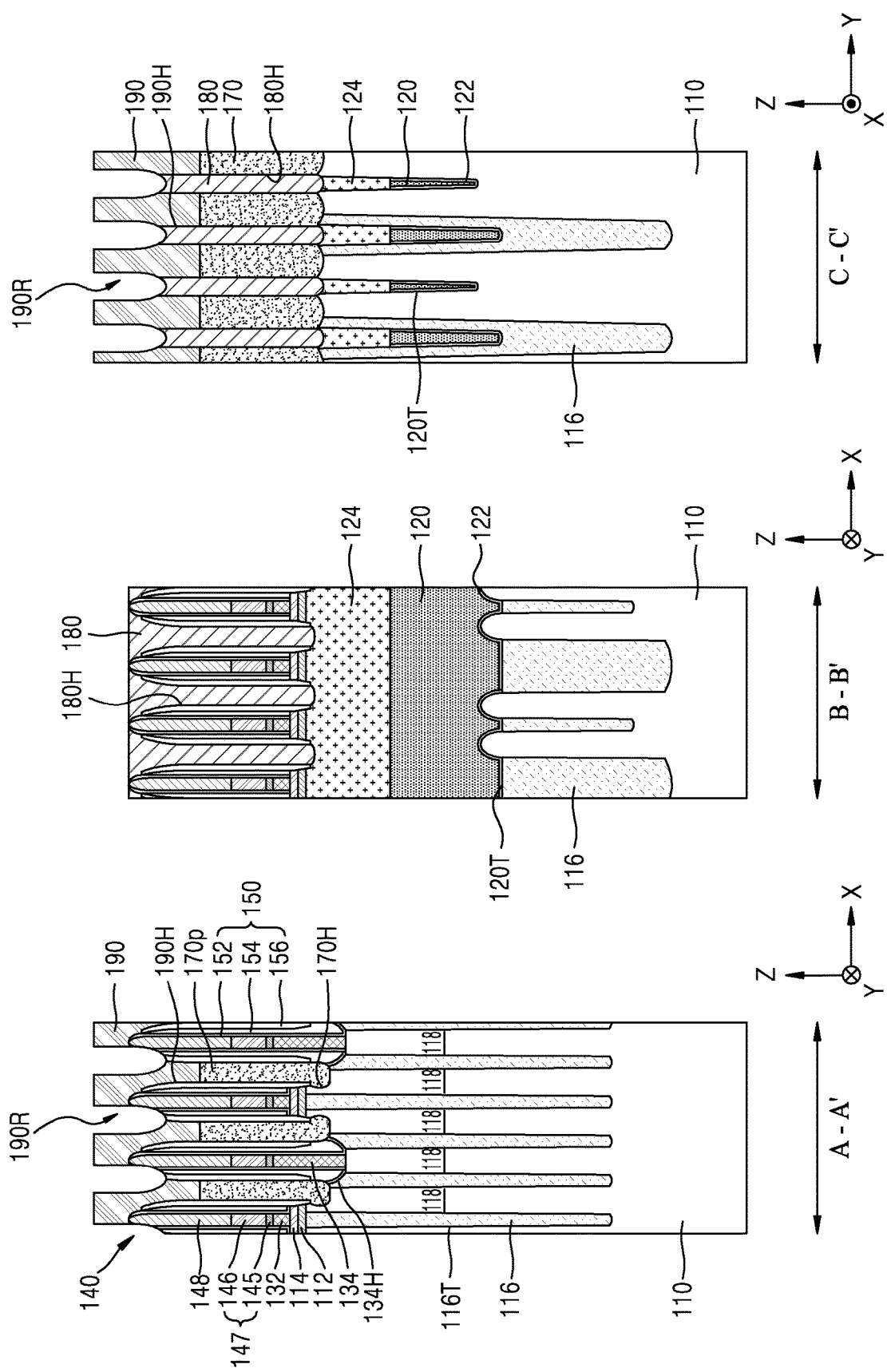

Referring to FIG. 12, a plurality of landing pads 190 that fill the plurality of landing pad holes 190H and extend over the plurality of bit lines 147 may be formed. The plurality of landing pads 190 may be on the plurality of buried contacts 170, and may extend over the plurality of bit lines 147. The plurality of landing pads 190 may be on the plurality of buried contacts 170, and each of the plurality of buried contacts 170 may be electrically connected to a corresponding one of the plurality of landing pads 190. The plurality of landing pads 190 may be connected to the active region 118 via the plurality of buried contacts 170. The plurality of landing pads 190 may constitute the plurality of landing pads LP illustrated in FIG. 1.

One landing pad 190 on one buried contact 170 together may be referred to as a contact structure. The buried contacts 170 constituting the contact structure may be between two bit line structures 140 adjacent to each other, and the landing pad 190 may be disposed on the buried contact 170 and extend, in a space between two adjacent bit line structures 140, from the buried contact 170 to one bit line structure 140. In other words, the landing pad 190 may be electrically connected to the buried contact 170, and may be formed to extend, in a space between two adjacent bit line structures 140, from the buried contact 170 to a top portion of one bit line structure 140 such that the landing pad 190 vertically overlaps one bit line structure 140.

In an example embodiment, a landing pad material layer may be formed to fill the plurality of landing pad holes 190H, covering the plurality of insulating capping lines 148 and the plurality of insulating fences 180. A portion of an upper surface of the landing pad material layer may be recessed to form a recess portion 190R, thereby forming the plurality of landing pads 190. The recess portion 190R may separate the landing pad material layers into the plurality of landing pads 190 each of which is connected to one of the plurality of buried contacts 170. The plurality of landing pads 190 may be spaced apart from each other with the recess portion 190R therebetween. In the recess portion 190R, the top end of the insulating spacer structure 150, the top end of the insulating capping line 148, and a top end of the insulating fence 180 may be exposed. In some embodiment, in the forming process of the recess portion 190R, the upper portion of the plurality of insulating spacer structures 150, the upper portion of the plurality of insulating capping lines 148, and an upper portion of the plurality of insulating fences 180 may be removed.

In some embodiment, a metal silicide layer may be formed on the plurality of buried contacts 170 before the plurality of landing pads 190 is formed. The metal silicide layer may be between the plurality of buried contacts 170 and the plurality of landing pads 190. The metal silicide layer may include cobalt silicide (CoSi), nickel silicide (NiSi), or manganese silicide (MnSi), but is not limited thereto.

In some embodiment, the plurality of landing pads 190 may include a conductive barrier layer and a conductive pad material layer on the conductive barrier layer. For example, the conductive barrier layer may include metal, conductive metal nitride, or a combination thereof. In some embodiment, the conductive barrier layer may have a Ti/TiN stacked structure. For example, the conductive pad material layer may include metal. In some embodiment, the conductive pad material layer may include W.

Figure 13:
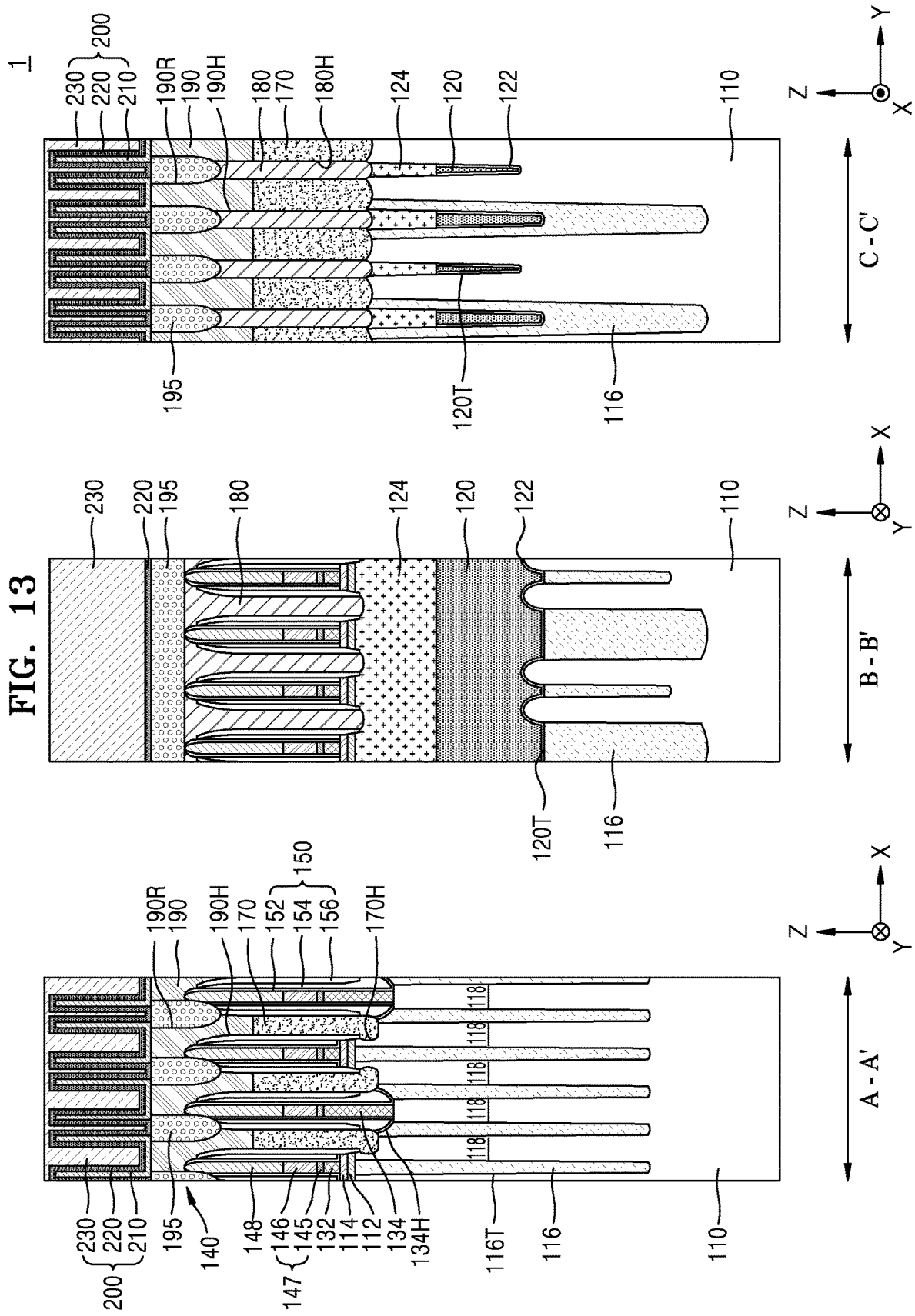
FIG. 13 is a cross-sectional view of main components of a semiconductor memory device, according to example embodiments of the inventive concept.

FIG. 13 is a cross-sectional view of the semiconductor memory device 1, according to example embodiments of the inventive concept. The semiconductor memory device 1 may correspond to the semiconductor device 10 of FIG. 1.

Referring to FIG. 13, a plurality of capacitor structures 200 may be formed by sequentially forming a plurality of bottom electrodes 210, a capacitor dielectric layer 220, and a top electrode 230 on the plurality of landing pads 190. Each of the plurality of bottom electrodes 210 may be electrically connected to a corresponding one of the plurality of land pads 190. The capacitor dielectric layer 220 may conformally cover the plurality of bottom electrodes 210. The top electrode 230 may cover the capacitor dielectric layer 220. The top electrode 230 may face the bottom electrode 210 with the capacitor dielectric layer 220 therebetween. Each of the capacitor dielectric layer 220 and the top electrode 230 may be integrally formed to cover the plurality of bottom electrodes 210 together, in a certain region, for example, in one cell block. The plurality of bottom electrodes 210 may constitute the plurality of storage nodes SN illustrated in FIG. 1.

Each of the plurality of bottom electrodes 210 may have a cylindrical shape with a closed one end, but is not limited thereto. In some embodiment, each of the plurality of bottom electrodes 210 may have a pillar shape, that is, a pillar shape the inside of which is filled to have a circular horizontal cross section. In some embodiment, the plurality of bottom electrodes 210 may be in a honeycomb zigzag shape with respect to the first horizontal direction (X direction) or the second horizontal direction (Y direction). In some other embodiment, the plurality of bottom electrodes 210 may be in a line matrix in the first horizontal direction (X direction) and the second horizontal direction (Y direction), respectively. The plurality of bottom electrodes 210 may include, for example, silicon doped with impurities, metal such as tungsten and copper, or a conductive metal compound such as titanium nitride. Although not separately illustrated, the semiconductor memory device 1 may further include at least one support pattern in contact with sidewalls of the plurality of bottom electrodes 210.

The capacitor dielectric layer 220 may include, for example, TaO, TaAlO, TaON, AlO, AlSiO, HfO, HfSiO, ZrO, ZrSiO, TiO, TiAlO, (Ba,Sr)TiO (BST), SrTiO (STO), BaTiO (BTO), Pb(Zr,Ti)O (PZT), (Pb,La)(Zr,Ti)O, Ba(Zr,Ti)O, Sr(Zr,Ti)O, or a combination thereof.

The top electrode 230 may include, for example, doped silicon, Ru, RuO, Pt, PtO, Ir, IrO, SrRuO (SRO), (Ba,Sr)RuO (BSRO), CaRuO (CRO), BaRuO, La(Sr,Co)O, Ti, TiN, W, WN, Ta, TaN, TiAlN, TiSiN, TaAlN, TaSiN, or a combination thereof.

Before the plurality of capacitor structures 200 is formed, an insulating structure 195 filling the recess portion 190R may be formed. In some embodiment, the insulating structure 195 may include an interlayer insulating layer and an etch stop layer. For example, the interlayer insulating layer may include an oxide layer, and the etch stop layer may include a nitride layer. FIG. 13 illustrates that a top surface of the insulating structure 195 and a bottom surface of the bottom electrode 210 are positioned at the same level, but the embodiment is not limited thereto. For example, a level of the top surface of the insulating structure 195 may be higher than a level of the bottom surface of the bottom electrode 210, and the bottom electrode 210 may extend toward the substrate 110 into the insulating structure 195.

The semiconductor memory device 1 may include the substrate 110 having the plurality of active regions 118. The plurality of gate dielectric layers 122, the plurality of word lines 120, and the plurality of buried insulating layers 124 may be sequentially formed inside the plurality of word line trenches 120T formed in the substrate 110. The element isolation layer 116 may define the plurality of active regions 118. The plurality of insulating layer patterns (112 and 114) may be formed to cover the plurality of buried insulating layers 124. The plurality of landing pads 190 may be formed to fill upper portions of first spaces defined by the plurality of insulating spacer structures 150 covering sidewalls of the plurality of bit line structures 140 and upper portions of second spaces between the plurality of insulating fences 180. The plurality of buried contacts 170 may fill lower portions of the first spaces and lower portions of the second spaces. Each of the plurality of buried contacts may be connected to a corresponding one of the plurality of active regions 118. Each of the plurality of landing pads may extend to the upper portion of a corresponding one of the plurality of bit line structures 140. The plurality of capacitor structures 200 may be formed to include the plurality of bottom electrodes 210, the capacitor dielectric layer 220, and the top electrode 230. Each of the bottom electrodes 210 may be connected to a corresponding one of the plurality of landing pads 190.

The plurality of insulating fences 180 may disposed in the space between a pair of insulating spacer structures 150 facing each other among the plurality of insulating spacer structures 150 covering both sidewalls of the plurality of bit line structures 140 and may be spaced apart from each other in the second horizontal direction (Y direction). Each of the plurality of insulating fences 180 may extend in the vertical direction (Z direction) from a space between the plurality of buried contacts 170 and to a space between the plurality of landing pads 190.

When the plurality of insulating fences 180 are first formed by patterning using an etching process before the preliminary buried contact material layer (170p in FIG. 5) is formed, the plurality of buried contact holes 170H may be difficult to form, and thus a distribution of electrical connection characteristics between the plurality of buried contacts 170 and the plurality of active regions 118 may increase in a semiconductor memory device. In addition, since a big loss may occur in the upper portions of the plurality of insulating capping lines 148 and the plurality of insulating spacer structures 150, a volume of the second insulating spacer 154 including a material of a relatively low permittivity or an air space formed by removing the second insulating spacer 154 may be reduced, and thus a parasite capacitance between the plurality of bit lines 147 may be increased.

However, since in the semiconductor memory device 1 according to various embodiments, the plurality of insulating fences 180 are formed after the plurality of buried contacts 170 are formed, electrical connection reliability between the plurality of buried contacts 170 and the plurality of active regions 118 may increase, and thus the distribution of electrical characteristics may decrease in the semiconductor memory device 10. In addition, since the plurality of insulating fences 180 are formed not by an etching process but by a damascene method of filling the plurality of fence holes 180H, an occurrence of the loss in the upper portions of the plurality of insulating capping lines 148 and in the upper portions of the plurality of insulating spacer structures 150 may be reduced, and thus an increase in the parasitic capacitance between the plurality of bit lines 147 may be prevented.

When the plurality of insulating fences 180 are first formed and then the upper portion of the preliminary buried contact material layer 170p is removed to form the plurality of buried contacts 170, in the process of forming the space (i.e., the plurality of fence holes 180H) for the plurality of insulating fences 180 by performing an etching process on the preliminary buried contact material layer 170p, defects in an etching profile of the space for the plurality of insulating fences 180 may occur.

However, in the semiconductor memory device 10 according to the inventive concept, after the upper portion of the preliminary buried contact material layer 170p is removed, and the mold layer 175 filling the removed portion of the upper portion of the preliminary buried contact material layer 170p is formed, the space for the plurality of insulating fences 180 may be formed by performing an etching process on the mold layer 175 and the preliminary buried contact material layer 170p. For example, when the mold layer 175 includes an oxide layer and the preliminary buried contact material layer 170p includes polysilicon, since an etching process is first performed on the mold layer 175 including an oxide layer, the etching profiles of the space (i.e., the plurality of fence holes 180H) for the insulating fence 180 may provide a better profile for its subsequent process of filling a conductive material in the space, and thus an electrical connection reliability between the plurality of capacitor structures 200 and the plurality of active regions 118 via the plurality of buried contacts 170 and the plurality of landing pads 190 between the plurality of insulating fences 180 may increase.

Figure 14:
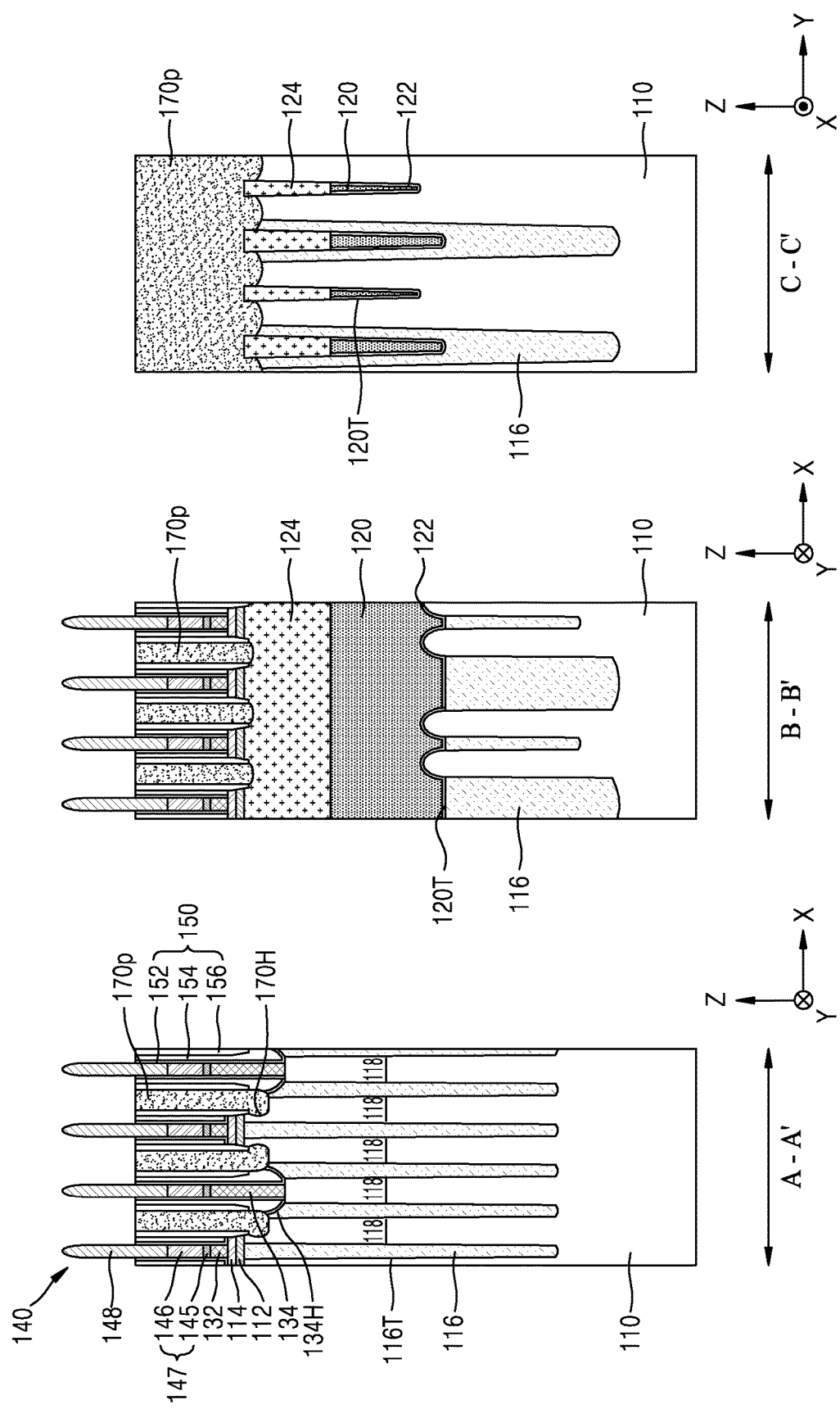
FIGS. 14 and 15 are cross-sectional views sequentially illustrating a method of manufacturing a semiconductor memory device, according to embodiments of the inventive concept.
Figure 15:
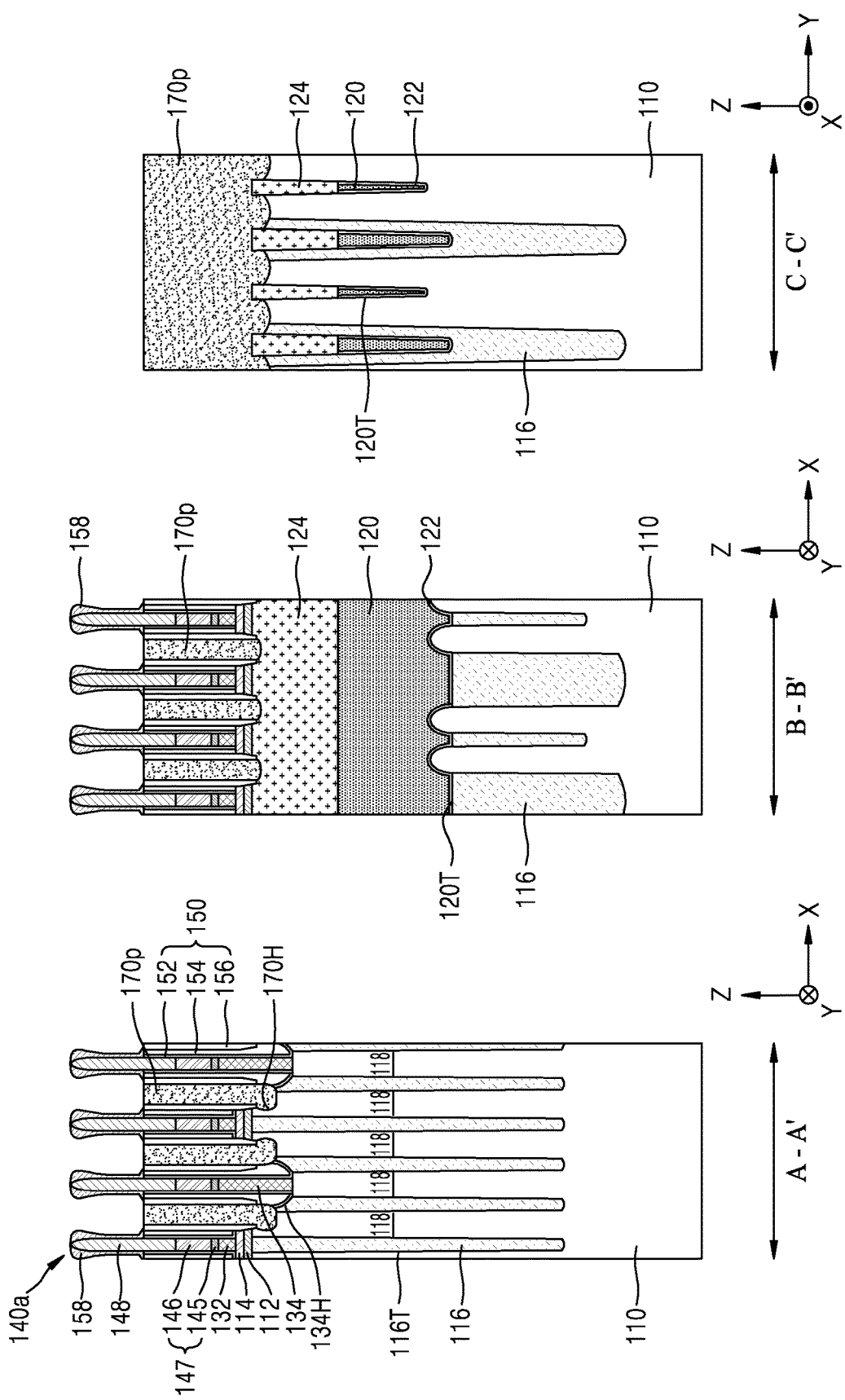

FIGS. 14 through 15 are cross-sectional views sequentially illustrating a manufacturing method of the semiconductor memory device 1, according to embodiments of the inventive concept. FIG. 14 is a cross-sectional view illustrating operations subsequent to an operation with reference to FIG. 6, and descriptions given with reference to FIGS. 14 and 15 that are duplicates of descriptions given with reference to FIGS. 2 through 12 are omitted, and the same reference numerals may denote the same components.

Referring to FIGS. 6 and 14 together, the upper portions of the plurality of insulating spacer structures 150 that are above the upper portions of the preliminary buried contact material layer 170p may be removed such that the upper portions of the plurality of insulating capping lines 148 protrude from the top surfaces of the plurality of preliminary buried contact material layer 170p.

Referring to FIG. 15, a plurality of expansion capping layers 158 that cover surfaces of the plurality of insulating capping lines 148 protruding toward top surfaces of the plurality of preliminary buried contact material layer 170p may be formed. One bit line 147, one insulating capping line 148 covering the one bit line 147, and one expansion capping layer 158 covering the surface of the insulating capping line 148 may constitute one bit line structure 140a. In an example embodiment, the plurality of expansion capping layers 158 may include or be formed of the same material, such as nitride, as that of the plurality of insulating capping lines 148.

The expansion capping layer 158 may cover a top surface of the second insulating spacer 154 on the top end of the plurality of insulating spacer structures 150. In some embodiment, the second insulating spacer 154 is removed and then the expansion capping layer 158 is formed to cover a top surface of the first insulating spacer 152 and a top surface of the third insulating spacer 156, thereby forming an air space defined by the first insulating spacer 152, the third insulating spacer 156, and the expansion capping layer 158. The second insulating spacer 154 may be replaced with the air spacer.

In the expansion capping layer 158, a width of a portion covering a top surface of the insulation capping line 148 may be greater than a width of a portion covering a side surface of the insulation capping line 148 protruding to the top surface of the preliminary buried contact material layer 170p. A top end of the bit line structure 140a may have a relatively large area by the expansion capping layer 158.

Figure 16:
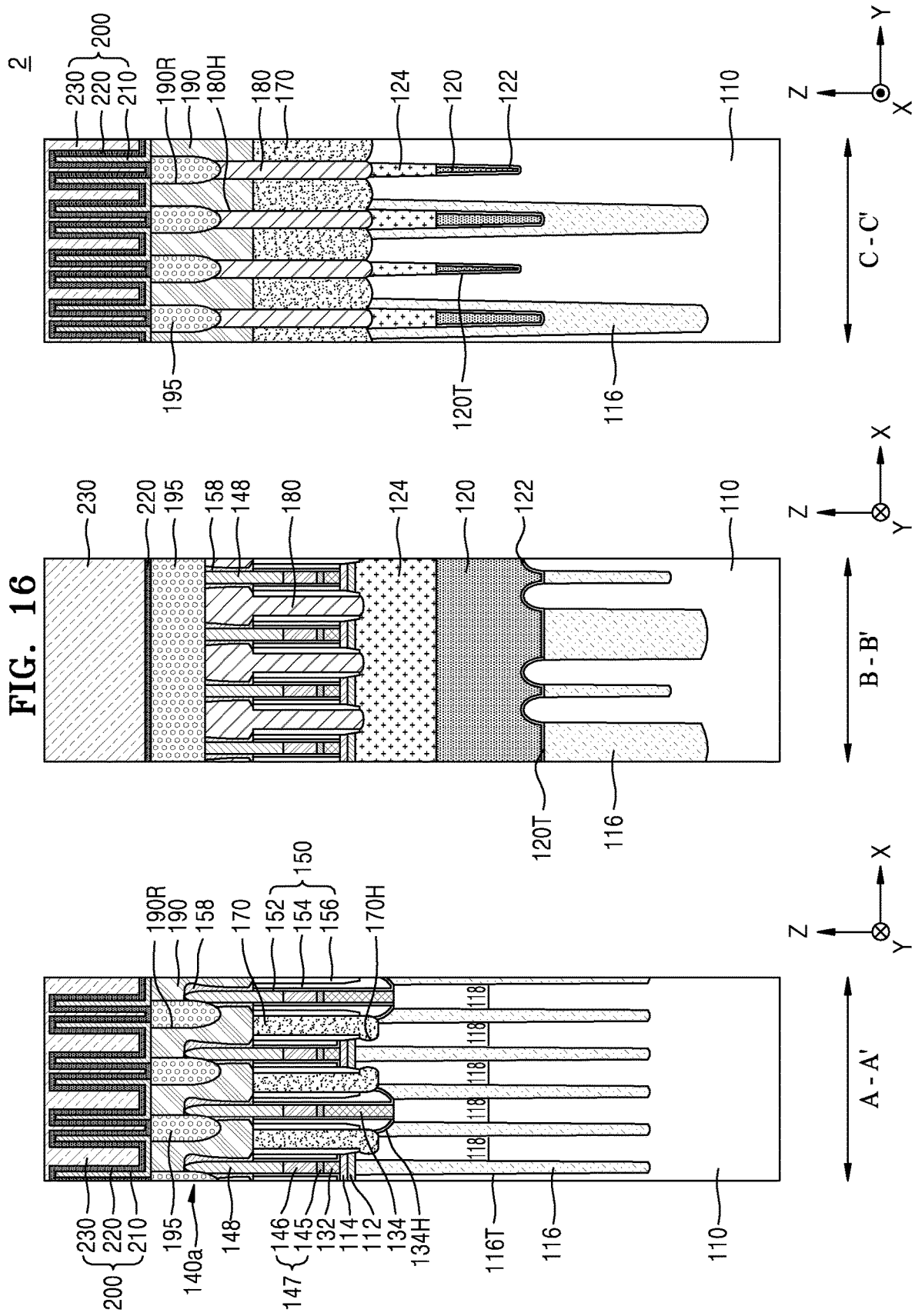
FIG. 16 is a cross-sectional view of main components of a semiconductor memory device, according to example embodiments of the inventive concept.

FIG. 16 is a cross-sectional view of main components of a semiconductor memory device 2, according to example embodiments of the inventive concept. The semiconductor memory device 2 may correspond to the semiconductor memory device 10 of FIG. 1.

Referring to FIG. 16, the semiconductor memory device 2 may be formed by performing the processes described with reference to FIGS. 7 through 13.

The semiconductor memory device 1 may include the substrate 110 having the plurality of active regions 118. The plurality of gate dielectric layers 122, the plurality of word lines 120, and the plurality of buried insulating layers 124 may be sequentially formed inside the plurality of word line trenches 120T formed in the substrate 110. The element isolation layer 116 may be formed to define the plurality of active regions 118. The plurality of insulating layer patterns (112 and 114) may be formed to cover the plurality of buried insulating layers 124. The plurality of bit line structures 140a may be formed on the plurality of insulating patterns (112 and 114). The plurality of landing pads 190 may be formed to fill first spaces defined by the plurality of insulating spacer structures 150 covering sidewalls of the plurality of bit line structures 140a and upper portions of second spaces between the plurality of insulating fences 180. The plurality of buried contacts 170 may fill lower portions of the first spaces and lower portions of the second spaces. Each of the plurality of buried contacts 170 may be connected to a corresponding one of the plurality of active regions 118. Each of the plurality of landing pads 190 may extend to the upper portion of a corresponding one of the plurality of bit line structures 140. The plurality of capacitor structures 200 may include the plurality of bottom electrodes 210, the capacitor dielectric layer 220, and the top electrode 230. Each of the plurality of bottom electrodes 210 may be connected to a corresponding one of the plurality of landing pads 190. The plurality of landing pads 190 may cover at least a portion of a top surface of the plurality of expansion capping layers 158 of the bit line structure 140a.

Figure 17:
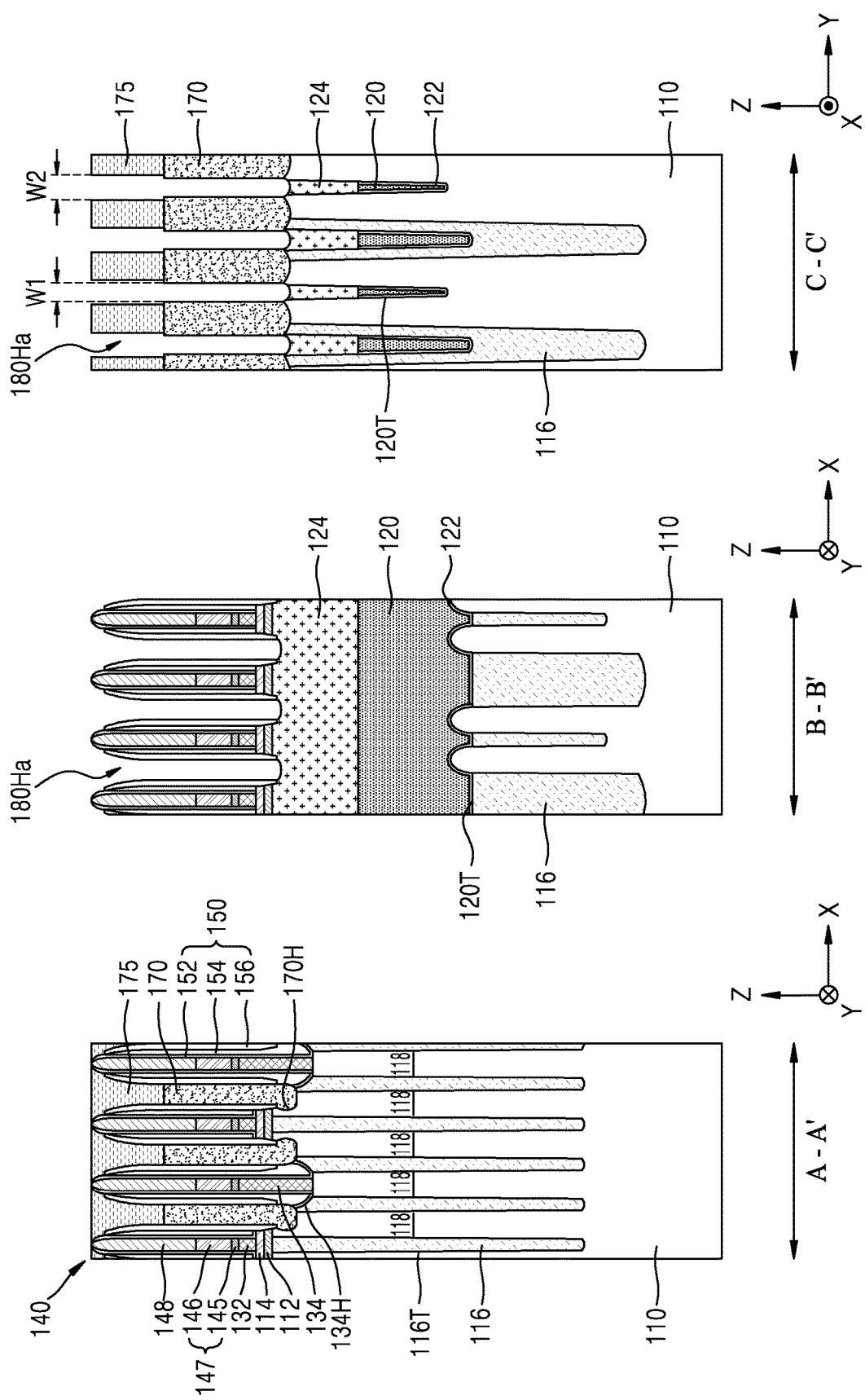
FIGS. 17 and 18 are cross-sectional views sequentially illustrating a method of manufacturing a semiconductor memory device, according to embodiments of the inventive concept.
Figure 18:
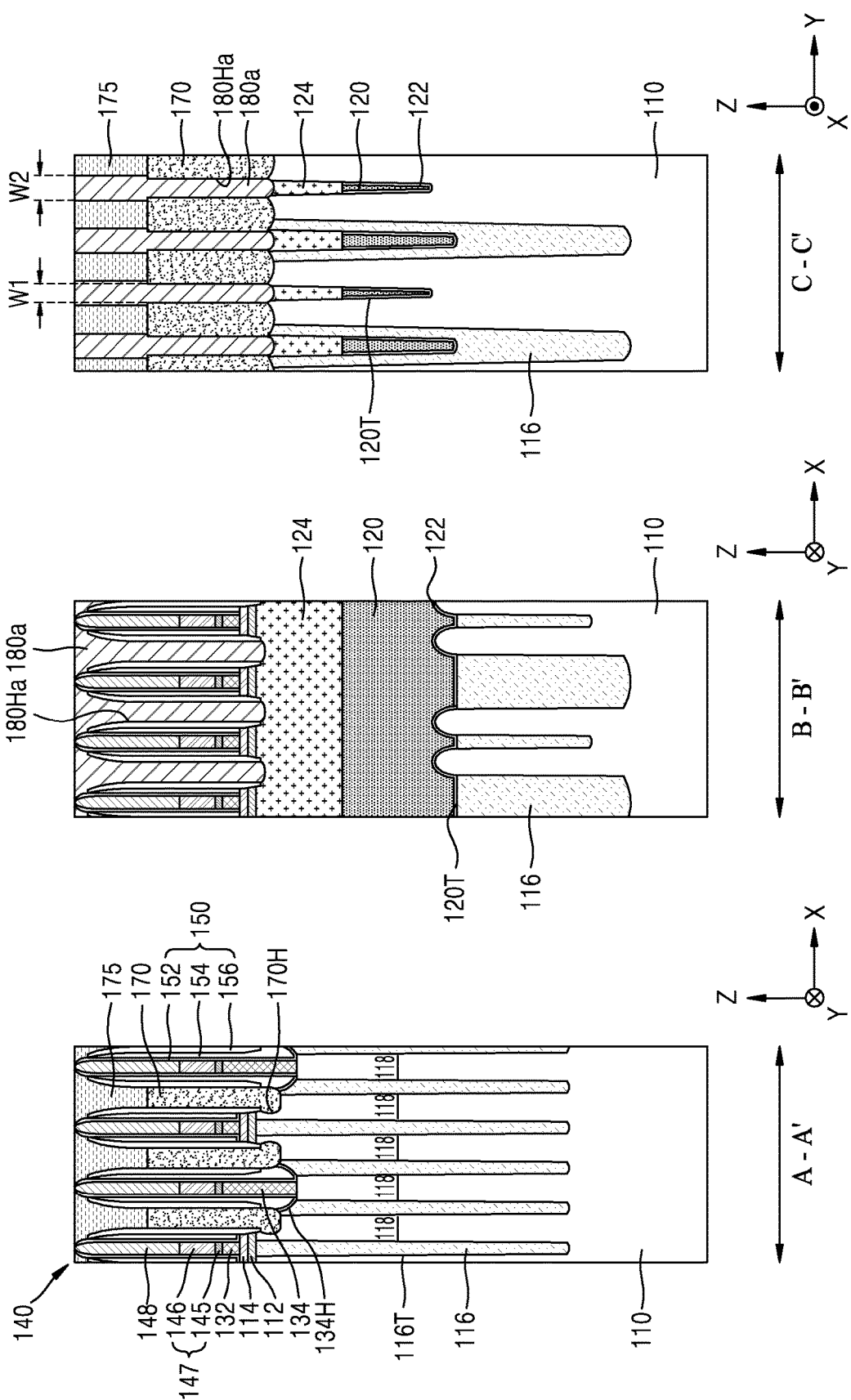

FIGS. 17 and 18 are cross-sectional views sequentially illustrating a manufacturing method of the semiconductor memory device 2, according to embodiments of the inventive concept. FIG. 17 is a cross-sectional view illustrating operations subsequent to an operation with reference to FIG. 8, and descriptions given with reference to FIGS. 17 and 18 that are duplicates of descriptions given with reference to FIGS. 2 through 12 are omitted, and the same reference numerals may denote the same components.

Referring to FIGS. 8 and 17 together, by removing a portion of the mold layer 175 and a portion of the preliminary buried contact material layer 170p by using the plurality of mask patterns MK as etching masks, a plurality of fence holes 180Ha that causes the buried insulating layer 124 to be exposed to a bottom surface of each of the plurality of fence holes 180Ha may be formed. In some embodiment, the plurality of fence holes 180Ha may be in a line in the first horizontal direction (X direction) and the second horizontal direction (Y direction), respectively.

The preliminary buried contact material layer 170p may be separated into a plurality of buried contacts 170 by the plurality of fence holes 180Ha.

In the process of forming the plurality of fence holes 180Ha, due to differences in etching characteristics of the mold layer 175 and the preliminary buried contact material layer 170p, a second width W2 that is a width of an upper portion of the plurality of fence holes 180Ha between a pair of the mold layers in the second horizontal direction (Y direction) may be greater than a first width W1 that is a width of a lower portion of the plurality of fence holes 180Ha between a pair of the buried contacts 170 in the second horizontal direction (Y direction) among the plurality of fence holes 180Ha. In other words, in the plurality of fence holes 180Ha, the first width W1 that is the width of the lower portion in the second horizontal direction (Y direction) may be less than the second width W2 that is the width of the upper portion in the second horizontal direction (Y direction). In some embodiment, the first width W1 may less than the second width W2 by about 1 nm to about 5 nm.

A width of the plurality of fence holes 180Ha in the first horizontal direction (X direction) may be defined by a width between a pair of insulating spacer structures 150 facing each other, and may increase in the vertical direction (Z direction) perpendicular to the substrate 110.

In some embodiment, after the plurality of fence holes 180H illustrated in FIG. 9 is formed, a portion of the mold layer 175 may be further removed to form the plurality of fence holes 180Ha illustrated in FIG. 17.

Referring to FIG. 18, a plurality of insulating fences 180a filling the plurality of fence holes 180Ha may be formed. The plurality of insulating fences 180a may include, for example, a nitride layer. After a fence material layer filling the plurality of fence holes 180Ha and covering a top surface of the mold layer 175 is formed, the plurality of insulating fences 180a may be formed by removing a portion of the fence material layer covering the top surface of the mold layer 175.

The plurality of buried contacts 170 may be in spaces defined by the plurality of insulating spacer structures 150 that cover sidewalls of the plurality of bit line structures 140, and by the plurality of insulating fences 180a. For example, each of the plurality of buried contacts 170 may be disposed in a space defined by two adjacent insulating spacer structures facing each other across the space (e.g., cross-section A-A' of FIG. 18) and by two adjacent insulating fences (e.g., cross-section C-C' of FIG. 18). For example, the plurality of buried contacts 170 may be spaced apart from each other in the first horizontal direction (X direction) by the plurality of insulating spacer structures 150 and spaced apart from each other in the second horizontal direction (Y direction) by the plurality of insulating fences 180a.

Figure 19:
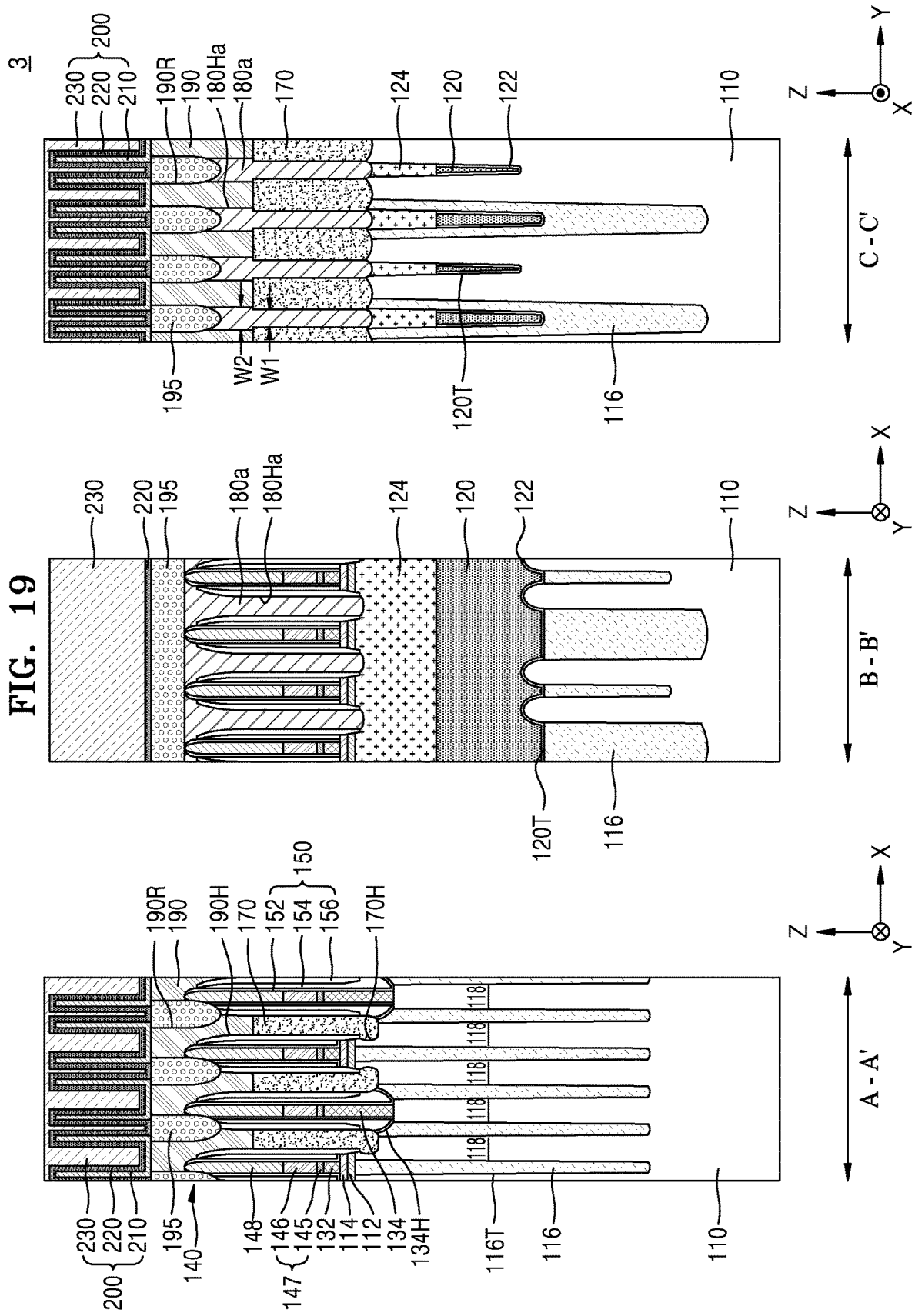
FIG. 19 is a cross-sectional view of main components of a semiconductor memory device, according to example embodiments of the inventive concept.

FIG. 19 is a cross-sectional view of a semiconductor memory device 3, according to example embodiments of the inventive concept. The semiconductor memory device 3 may correspond to the semiconductor device 10 of FIG. 1.

Referring to FIG. 19, the semiconductor memory device 3 may be formed by performing the processes described with reference to FIGS. 10 through 13 on the resulting structure of FIG. 18.

The semiconductor memory device 3 may include the substrate 110 having the plurality of active regions 118. The plurality of gate dielectric layers 122, the plurality of word lines 120, and the plurality of buried insulating layers 124 may be sequentially formed inside the plurality of word line trenches 120T formed in the substrate 110. The element isolation layer 116 may be formed to define the plurality of active regions 118. The plurality of insulating layer patterns (112 and 114) may be formed to cover the plurality of buried insulating layers 124. The plurality of landing pads 190 may be formed to fill upper portions of first spaces defined by the plurality of insulating spacer structures 150 covering sidewalls of the plurality of bit line structures 140 and upper portions of second spaces between the plurality of insulating fences 180a. The plurality of buried contacts 170 may fill lower portions of the first spaces and lower portions of the second spaces. Each of the plurality of buried contacts 170 may be connected to a corresponding one of the plurality of active regions 118. Each of the plurality of landing pads 190 may extend to the upper portion of a corresponding one of the plurality of bit line structures 140. The plurality of capacitor structures 200 may be formed to include the plurality of bottom electrodes 210, the capacitor dielectric layer 220, and the top electrode 230. Each of the plurality of bottom electrodes 210 may be connected to a corresponding one of the plurality of landing pads 190.

Since the plurality of insulating fences 180a fill the plurality of fence holes 180Ha, the first width W1 that is the width of the lower portion of the plurality of insulating fences 180a in the second horizontal direction (Y direction) between a pair of buried contacts 170 among the plurality of insulating fences 180a may be less than the second width W2 that is the width of the upper portion of the plurality of insulating fences 180a in the second horizontal direction (Y direction) between a pair of landing pads 190. The upper portions and the lower portions of the plurality of insulating fences 180a may be portions more distant from the substrate 110 and portions closer to the substrate 110 in the vertical direction (Z direction) in a region where the plurality of buried contacts 170 overlap the plurality of landing pads 190, respectively. In other words, in the plurality of insulating fences 180a, the first width W1 that is the width of the lower portion in the second horizontal direction (Y direction) may be less than the second width W2 that is the width of the upper portion in the second horizontal direction (Y direction).

A width of the plurality of fence holes 180Ha in the first horizontal direction (X direction) may be defined by a width between a pair of insulating spacer structures 150 facing each other, and may increase in the vertical direction (Z direction) perpendicular to the substrate 110.

In the semiconductor memory device 3, the second width W2 of the upper portion of each of the plurality of insulating fences 180a in the second horizontal direction (Y direction) may be greater than the first width W1 of the lower portion of each of the plurality of insulating fences 180a in the second horizontal direction (Y direction), and thus the plurality of buried contacts 170 between the lower portions of the plurality of insulating fences 180a may have a relatively large horizontal width in the second horizontal direction (Y direction). Thus, the specific resistance of the plurality of buried contacts 170 may have a relatively small value, and the reliability of the electrical connection between the plurality of buried contacts 170 and the plurality of active regions 118 may increase.

Figure 20:
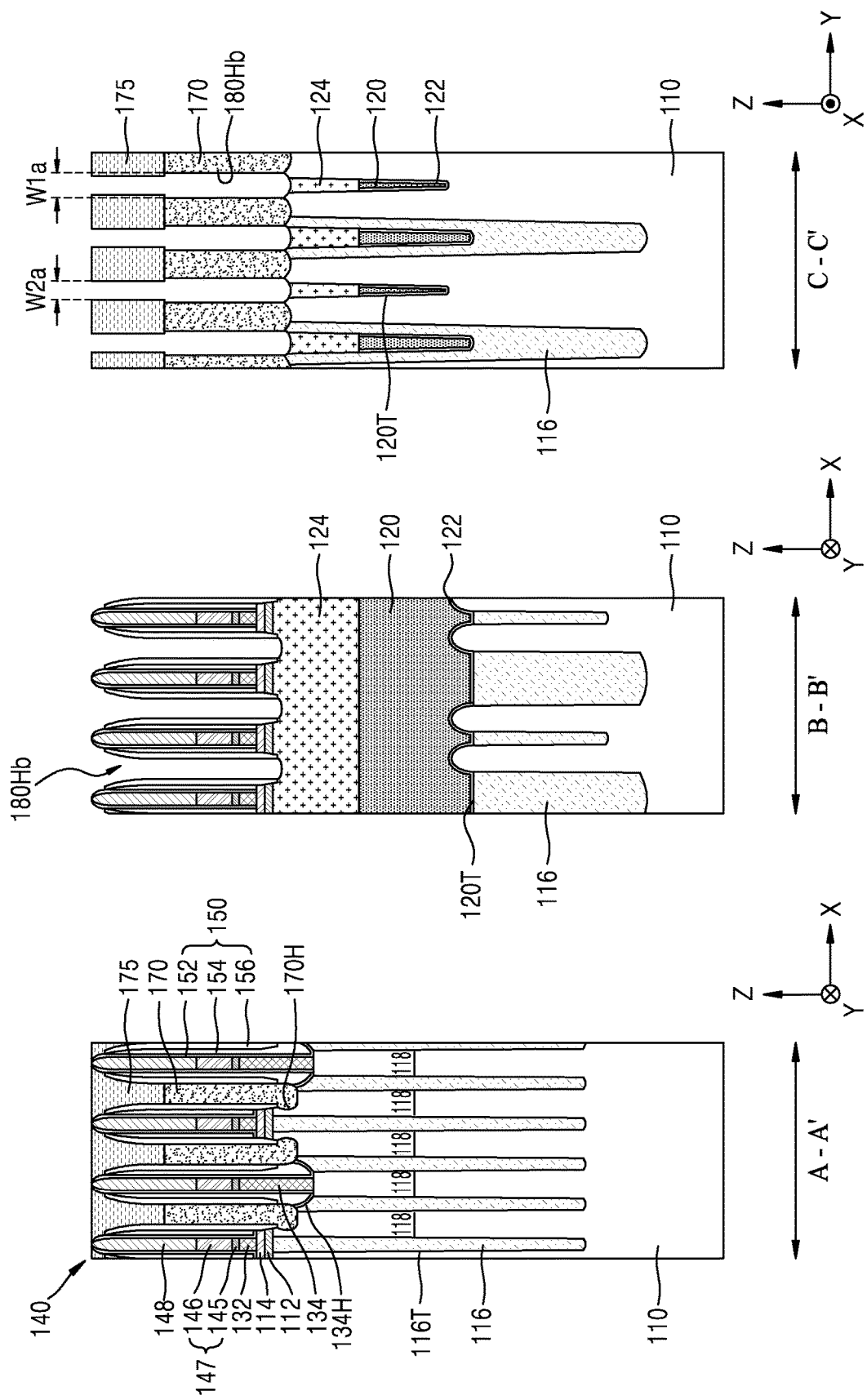
FIGS. 20 and 21 are cross-sectional views sequentially illustrating a method of manufacturing a semiconductor memory device, according to embodiments of the inventive concept.
Figure 21:
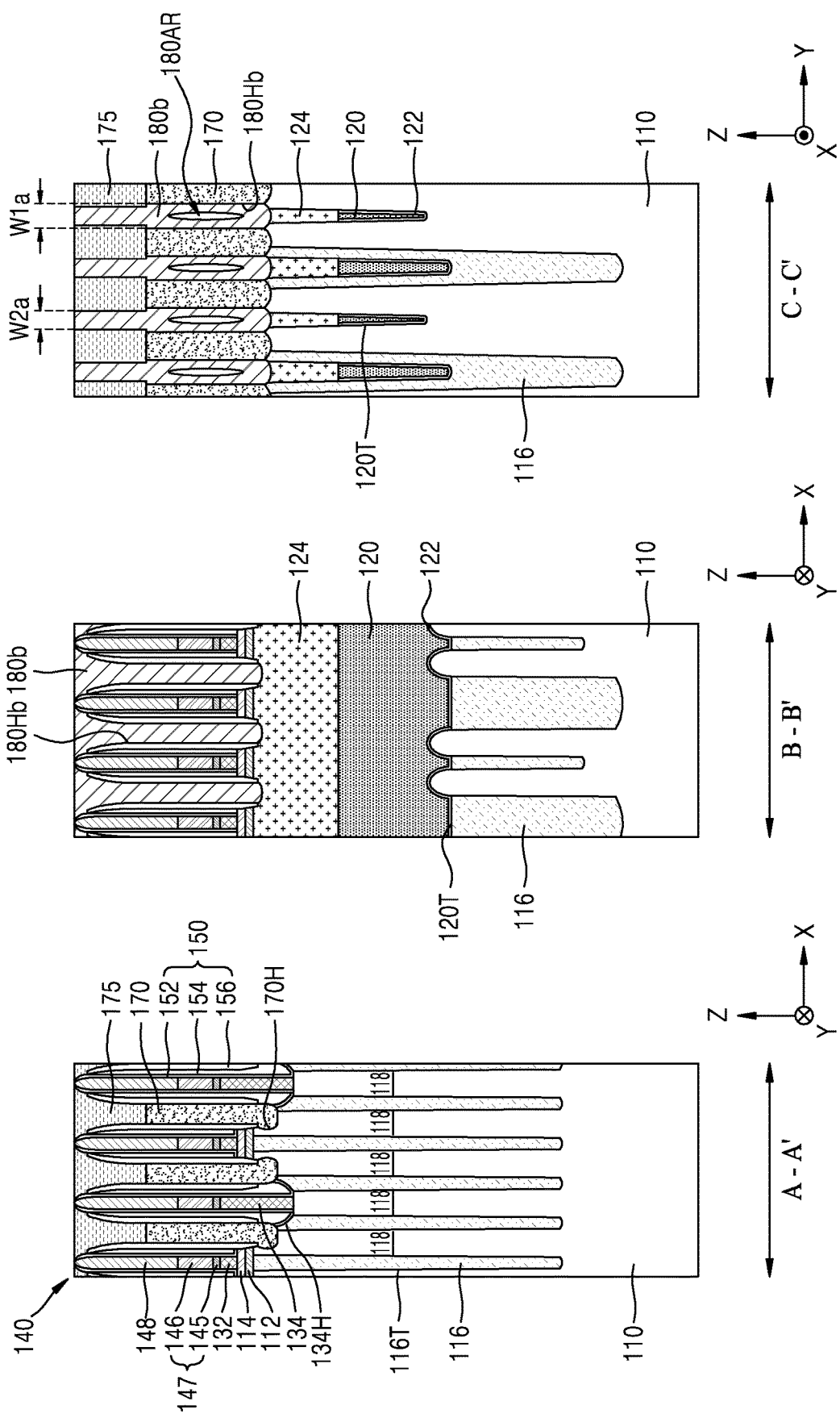

FIGS. 20 and 21 are cross-sectional views sequentially illustrating a manufacturing method of the semiconductor memory device 3, according to embodiments of the inventive concept. FIG. 20 is a cross-sectional view illustrating operations subsequent to an operation with reference to FIG. 8, and descriptions given with reference to FIGS. 20 and 21 that are duplicates of descriptions given with reference to FIGS. 2 through 12 are omitted, and the same reference numerals may denote the same components.

Referring to FIGS. 8 and 20 together, by removing a portion of the mold layer 175 and a portion of the preliminary buried contact material layer 170p by using the plurality of mask patterns MK as etching masks, a plurality of fence holes 180Hb that causes the buried insulating layer 124 to be exposed to a bottom surface thereof may be formed. In some embodiment, the plurality of fence holes 180Hb may be in a line in the first horizontal direction (X direction) and the second horizontal direction (Y direction), respectively. In an example embodiment, the mold layer 175 and the preliminary buried contact material layer 170p may be patterned, by performing an etching process using the plurality of mask patterns MK as an etch mask, to form a plurality of mold patterns separated from each other and the plurality of buried contacts 170 separated from each other, respectively.

The preliminary buried contact material layer 170p may be separated into a plurality of buried contacts 170 by the plurality of fence holes 180Hb.

In the process of forming the plurality of fence holes 180Hb, due to differences in etching characteristics of the mold layer 175 and the preliminary buried contact material layer 170p, a second width W2a that is a width of an upper portion of the plurality of fence holes 180Hb between a pair of the mold layers 175 (i.e., a pair of the mold patterns) in the second horizontal direction (Y direction) may be less than a first width W1a that is a width of a lower portion of the plurality of fence holes 180Hb between a pair of the buried contacts 170 in the second horizontal direction (Y direction). In other words, in the plurality of fence holes 180Hb, the second width W2a that is the width of the upper portion in the second horizontal direction (Y direction) may be less than the first width W1a that is the width of the lower portion in the second horizontal direction (Y direction). In some embodiment, the first width W1a may be greater than the second width W2a by about 1 nm to about 5 nm.

A width of the plurality of fence holes 180Hb in the first horizontal direction (X direction) may be defined by a width between a pair of insulating spacer structures 150 facing each other, and may increase in the vertical direction (Z direction) perpendicular to the substrate 110.

In some embodiment, after the plurality of fence holes 180H illustrated in FIG. 9 is formed, by further removing a portion of the buried contact 170, the plurality of fence holes 180Hb illustrated in FIG. 20 may be formed.

Referring to FIG. 21, a plurality of insulating fences 180b filling the plurality of fence holes 180Hb may be formed. The plurality of insulating fences 180b may include, for example, a nitride layer. After a fence material layer filling the plurality of fence holes 180Hb and covering a top surface of the mold layer 175 is formed, the plurality of insulating fences 180b may be formed by removing a portion of the fence material layer covering the top surface of the mold layer 175.

The plurality of buried contacts 170 may be in spaces defined by the plurality of insulating spacer structures 150 that cover sidewalls of the plurality of bit line structures 140, and by the plurality of insulating fences 180b. For example, each of the plurality of buried contacts 170 may be disposed in a space defined by two adjacent insulating spacer structures facing each other across the space (e.g., cross-section A-A' of FIG. 21) and by two adjacent insulating fences (e.g., cross-section C-C' of FIG. 21). For example, the plurality of buried contacts 170 may be spaced apart from each other in the first horizontal direction (X direction) by the plurality of insulating spacer structures 150 and spaced apart from each other in the second horizontal direction (Y direction) by the plurality of insulating fences 180b.

Each of the plurality of insulating fences 180b may include an air gap 180AR therein. In some embodiment, the air gap 180AR may be inside the lower portion of each of the plurality of insulating fences 180b. The lower portion of each of the plurality of insulating fences 180b may be a portion thereof between a pair of buried contacts 170.

Figure 22:
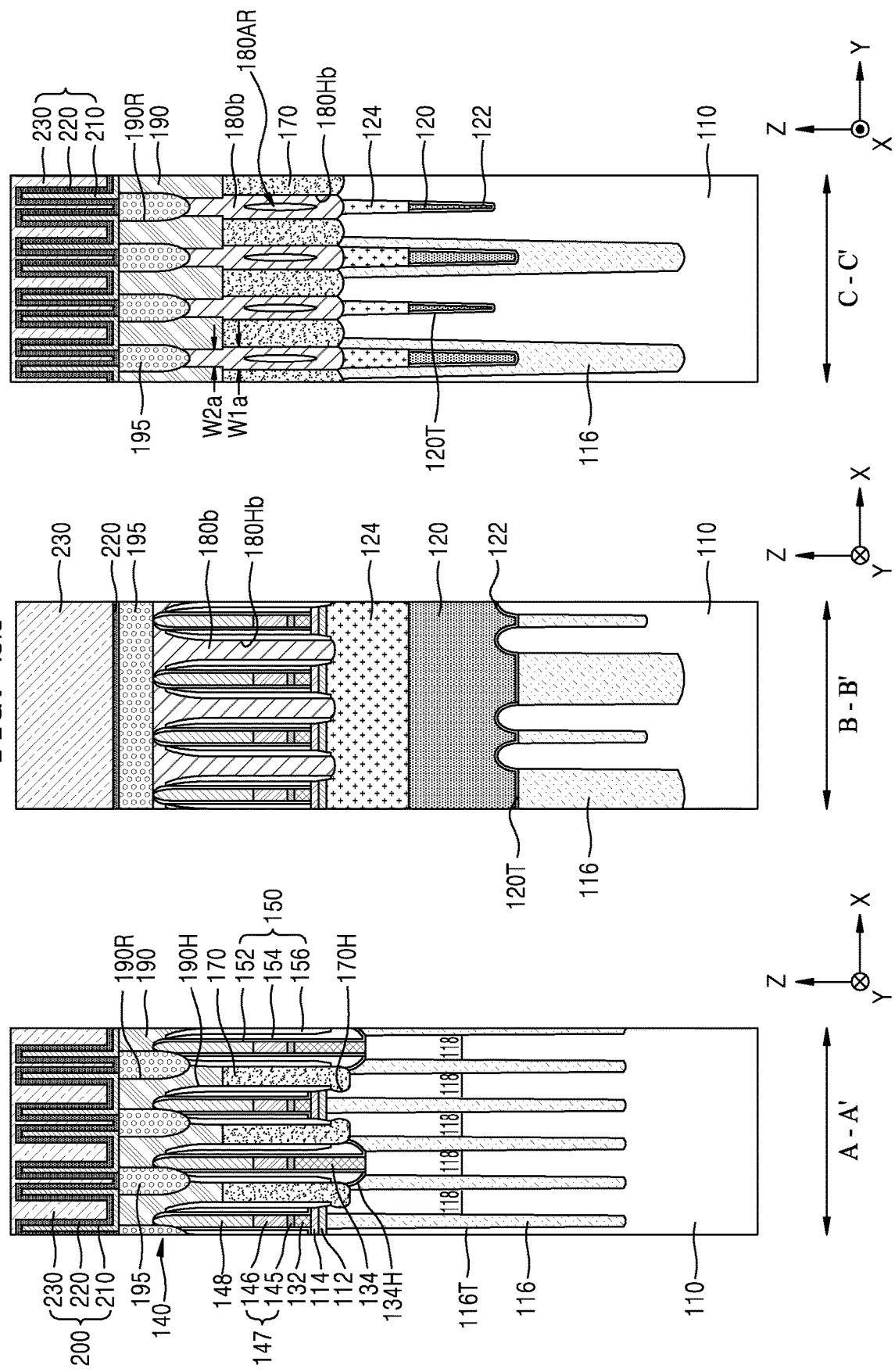
FIG. 22 is a cross-sectional view of main components of a semiconductor memory device, according to example embodiments of the inventive concept.

FIG. 22 is a cross-sectional view of a semiconductor memory device 4, according to example embodiments of the inventive concept. The semiconductor memory device 4 may correspond to the semiconductor device 10 of FIG. 1.

Referring to FIG. 22, the semiconductor memory device 4 may be formed by performing the processes described with reference to FIGS. 10 through 13.

The semiconductor memory device 4 may include the substrate 110 having the plurality of active regions 118. The plurality of gate dielectric layers 122, the plurality of word lines 120, and the plurality of buried insulating layers 124 may be sequentially formed inside the plurality of word line trenches 120T formed in the substrate 110. The element isolation layer 116 may define the plurality of active regions 118. The plurality of insulating layer patterns (112 and 114) may be formed to cover the plurality of buried insulating layers 124. The plurality of landing pads 190 may be formed to fill the upper portions of first spaces defined by the plurality of insulating spacer structures 150 covering sidewalls of the plurality of bit line structures 140 and the upper portions of second spaces between the plurality of insulating fences 180b. The plurality of buried contacts 170 may fill the lower portions of the first spaces and the lower portion of the second spaces. Each of the plurality of buried contacts 170 may be connected to a corresponding one of the plurality of active regions 118. Each of the plurality of landing pads 190 may extend to the upper portion of a corresponding one of the plurality of bit line structures 140. The plurality of capacitor structures 200 may be formed to include the plurality of bottom electrodes 210, the capacitor dielectric layer 220, and the top electrode 230. The plurality of bottom electrodes 210 may be connected to the plurality of landing pads 190.

Since the plurality of insulating fences 180*b* fill the plurality of fence holes 180Hb, the first width W1*a* that is a width of a lower portion of each of the plurality of insulating fences 180*b* in the second horizontal direction (Y direction) between a pair of buried contacts 170 may be greater than the second width W2*a* that is a width of an upper portion of each of the plurality of insulating fences 180*b* in the second horizontal direction (Y direction) between a pair of landing pads 190. The upper portions and the lower portions of the plurality of insulating fences 180*b* may be portions away from the substrate 110 and portions toward the substrate 110 in the vertical direction (Z direction) based on portions where the plurality of buried contacts 170 overlap the plurality of landing pads 190, respectively. In other words, in the plurality of insulating fences 180*b*, the first width W1*a* that is the width of the lower portion in the second horizontal direction (Y direction) may be greater than the second width W2*a* that is the width of the upper portion in the second horizontal direction (Y direction).

A width of the plurality of fence holes 180Hb in the first horizontal direction (X direction) may be defined by a width between a pair of insulating spacer structures 150 facing each other, and may increase in the vertical direction (Z direction) perpendicular to the substrate 110.

In the semiconductor memory device 4, the second width W2*a* of the upper portion of each of the plurality of insulating fences 180*b* in the second horizontal direction (Y direction) may be less than the first width W1*a* of the lower portion of each of the plurality of insulating fences 180*b* in the second horizontal direction (Y direction), and thus, the plurality of landing pads 190 between the upper portions of each of the plurality of insulating fences 180*a* may have a relatively large width in the second horizontal direction (Y direction). Thus, the specific resistance of the plurality of landing pads 190 may have a relatively small value, and the reliability of the electrical connection between the plurality of buried contacts 170 and the plurality of capacitor structures 200 may increase.

In addition, since the semiconductor memory device 4 includes the air gap 180AR in each of the plurality of insulating fences 180*b*, the parasitic capacitance of a space between a pair of buried contacts 170 having each of the plurality of insulating fences 180*b* therebetween may decrease.

Figure 23:
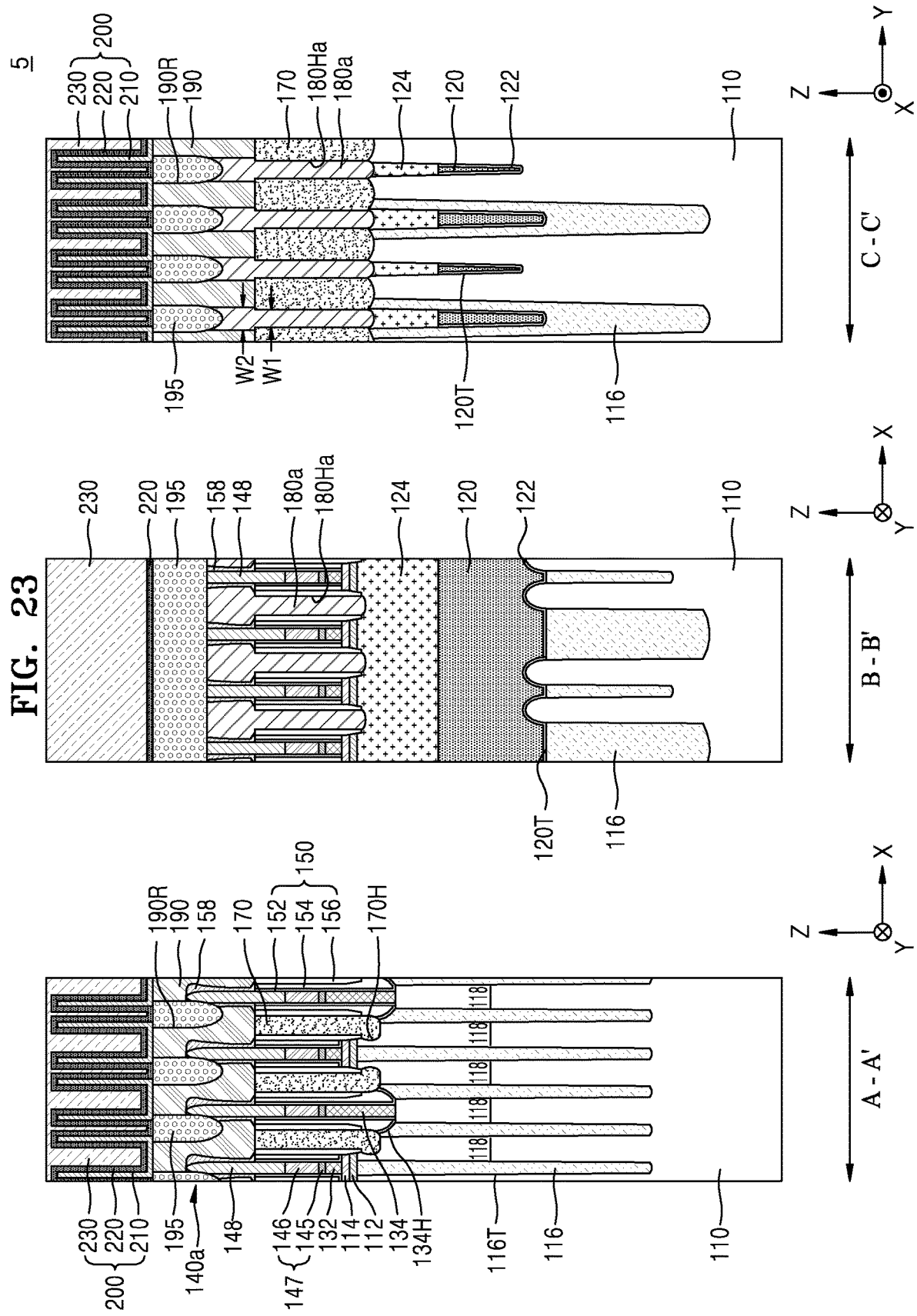
FIG. 23 is a cross-sectional view of main components of a semiconductor memory device, according to example embodiments of the inventive concept.

FIG. 23 is a cross-sectional view of a semiconductor memory device 5, according to example embodiments of the inventive concept. The semiconductor device 5 may correspond to the semiconductor device 10 of FIG. 1.

Referring to FIG. 23, the semiconductor memory device 5 may include the substrate 110 having the plurality of active regions 118. The plurality of gate dielectric layers 122, the plurality of word lines 120, and the plurality of buried insulating layers 124 may be sequentially formed inside the plurality of word line trenches 120T formed in the substrate 110. The element isolation layer 116 may define the plurality of active regions 118. The plurality of insulating layer patterns (112 and 114) may be formed to cover the plurality of buried insulating layers 124. The plurality of bit line structures 140*a* may be formed on the plurality of insulating patterns (112 and 114). The plurality of landing pad 190 may be formed to the upper portions of first spaces defined by the plurality of insulating spacer structures 150 covering sidewalls of the plurality of bit line structures 140*a* and the upper portions of second spaces between the plurality of insulating fences 180*a*. The plurality of buried contacts 170 may fill the lower portion of the first spaces and the lower portions of the second spaces. Each of the plurality of buried contacts 170 may be connected to a corresponding one of the plurality of active regions 118. Each of the plurality of landing pads 190 may extend to the upper portion of a corresponding one of the plurality of bit line structures 140. The plurality of capacitor structures 200 may be formed to include the plurality of bottom electrodes 210, the capacitor dielectric layer 220, and the top electrode 230. Each of the plurality of bottom electrodes 210 may be connected to a corresponding one of the plurality of landing pads 190. The plurality of landing pads 190 may cover at least a portion of a top surface of the plurality of expansion capping layers 158 of the bit line structure 140*a*.

The semiconductor memory device 5 may include a plurality of insulating fences 180*a* instead of the plurality of insulating fences 180 of the semiconductor memory device 2 illustrated in FIG. 16. Accordingly, in the semiconductor memory device 5, the second width W2 of the upper portion of each of the plurality of insulating fences 180*a* in the second horizontal direction (Y direction) may be greater than the first width W1 of the lower portion of each of the plurality of insulating fences 180*a* in the second horizontal direction (Y direction), and thus each of the plurality of buried contacts 170 between the lower portions of the plurality of insulating fences 180*a* may have a relatively large width in the second horizontal direction (Y direction). Thus, the specific resistance of the plurality of buried contacts 170 may have a relatively small value, and the reliability of the electrical connection between the plurality of buried contacts 170 and the plurality of active regions 118 may increase.

Figure 24:
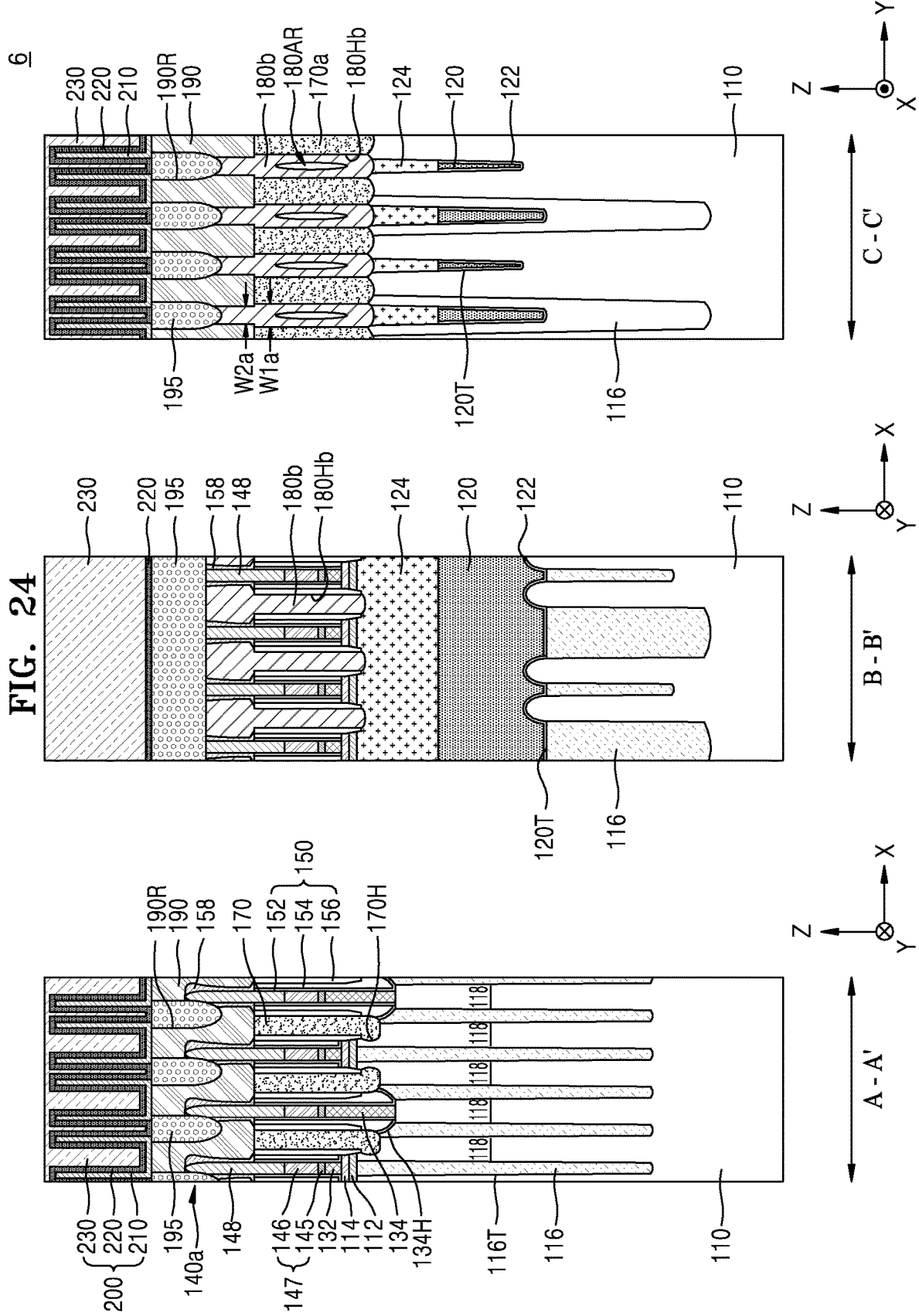
FIG. 24 is a cross-sectional view of main components of a semiconductor memory device, according to example embodiments of the inventive concept.

FIG. 24 is a cross-sectional view of a semiconductor memory device 6, according to example embodiments of the inventive concept. The semiconductor memory device 6 may correspond to the semiconductor device 10 of FIG. 1.

Referring to FIG. 24, the semiconductor memory device 6 may include the substrate 110 having the plurality of active regions 118. The plurality of gate dielectric layers 122, the plurality of word lines 120, and the plurality of buried insulating layers 124 may be sequentially formed inside the plurality of word line trenches 120T formed in the substrate 110. The element isolation layer 116 may be formed to define the plurality of active regions 118. The plurality of insulating layer patterns (112 and 114) may be formed to cover the plurality of buried insulating layers 124. The plurality of bit line structures 140*a* may be formed on the plurality of insulating patterns (112 and 114). The plurality of landing pads 190 may be formed to fill the upper portions of first spaces defined by the plurality of insulating spacer structures 150 covering sidewalls of the plurality of bit line structures 140*a* and second spaces between the plurality of insulating spacer structures 150. The plurality of buried contacts 170 may fill the lower portions of the first spaces and the lower portions of the second spaces. Each of the plurality of buried contacts 170 may be connected to a corresponding one of the plurality of active regions 118. Each of the plurality of landing pads 190 may extend to the upper portion of a corresponding one of the plurality of bit line structures 140. The plurality of capacitor structures 200 may be formed to include the plurality of bottom electrodes 210, the capacitor dielectric layer 220, and the top electrode 230. Each of the plurality of bottom electrodes 210 may be connected to a corresponding one of the plurality of landing pads 190. The plurality of landing pads 190 may cover at least a portion of a top surface of the plurality of expansion capping layers 158 of the bit line structure 140a.

The semiconductor memory device 6 may include a plurality of insulating fences 180b instead of the plurality of insulating fences 180a of the semiconductor memory device 2 illustrated in FIG. 16. Accordingly, in the semiconductor memory device 6, since the second width W2a of the upper portion of each of the plurality of insulating fences 180b in the second horizontal direction (Y direction) may be less than the first width W1a of the lower portion of each of the plurality of insulating fences 180b in the second horizontal direction (Y direction), the plurality of landing pads 190 between the upper portions of each of the plurality of insulating fences 180a may have a relatively large width in the second horizontal direction (Y direction). Thus, the specific resistance of the plurality of landing pads 190 may have a relatively small value, and the reliability of the electrical connection between the plurality of buried contacts 170 and the plurality of capacitor structures 200 may increase.

In addition, since the semiconductor memory device 6 includes an air gap 180AR in each of the plurality of insulating fences 180b, the parasitic capacitance of a space (i.e., each of the plurality of insulating fences 180b) between a pair of buried contacts 170 may be reduced.

While the present inventive concept has been particularly shown and described with reference to example embodiments thereof, the present inventive concept is not limited to the example embodiments, and various changes and modifications may be made by those of ordinary skill in the art without departing from the spirit and scope of the present inventive concept.

While the inventive concept has been particularly shown and described with reference to embodiments thereof, it will be understood that various changes in form and details may be made therein without departing from the spirit and scope of the following claims.

What is claimed is:

1. A semiconductor memory device comprising:
   a substrate;
   a plurality of bit line structures extending in parallel with each other in a first horizontal direction on the substrate;
   a plurality of first insulating spacer structures covering first sidewalls of the plurality of bit line structures;
   a plurality of second insulating spacer structures covering second sidewalls of the plurality of bit line structures;
   a plurality of insulating fences disposed in a first space between one of the plurality of first insulating spacer structures and one of the plurality of second insulating spacer structures adjacent thereto in a second horizontal direction perpendicular to the first horizontal direction and spaced apart from each other in the first horizontal direction;
   a plurality of buried contacts filling a lower portion of the first space and spaced apart from each other in the first horizontal direction; and
   a plurality of landing pads filling an upper portion of the first space, extending to an upper portion of a corresponding one of the plurality of bit line structures, and spaced apart from each other in the first horizontal direction,
   wherein each of the plurality of insulating fences between corresponding pair of buried contacts among the plurality of buried contacts includes a lower portion and an upper portion which are connected with each other at a height of a bottommost surface of a corresponding pair of landing pads among the plurality of landing pads,
   wherein a first width of an uppermost surface of the lower portion is different from a second width of a lowermost surface of the upper portion, and the first and second widths are measured in the first horizontal direction, and
   wherein the bottommost surface of the upper portion is connected to the uppermost surface of the lower portion at the same level to constitute a stepped surface.

2. The semiconductor memory device of claim 1,
   wherein the second width of each of the plurality of insulating fences is greater than the first width of each of the plurality of insulating fences.

3. The semiconductor memory device of claim 1,
   wherein the first width of each of the plurality of insulating fences is greater than the second width of each of the plurality of insulating fences.

4. The semiconductor memory device of claim 3,
   wherein each of the plurality of insulating fences comprise an air gap therein, the air gap being disposed between two adjacent buried contacts of the plurality of buried contacts, and
   wherein an uppermost end of the air gap is lower than the bottommost surface of the corresponding pair of landing pads.

5. The semiconductor memory device of claim 1,
   wherein each of the plurality of bit line structures comprises a bit line and an insulating capping line stacked on the bit line, and
   wherein an upper portion of the insulating capping line of each of the plurality of bit line structures protrudes from between a corresponding one of the plurality of first insulating spacer structures and a corresponding one of the plurality of second insulating spacer structures, adjacent to each other.

6. The semiconductor memory device of claim 5, further comprising:
   an expansion capping layer covering the upper portion of the insulating capping line.

7. The semiconductor memory device of claim 6,
   wherein the expansion capping layer has a first portion covering a side surface of the upper portion of the insulating capping line and a second portion covering a top surface thereof, a third width of the first portion greater than a fourth width of the second portion.

8. The semiconductor memory device of claim 6,
   wherein each of the plurality of landing pads contacts a top surface of the expansion capping layer.

9. The semiconductor memory device of claim 1,
   wherein each of the plurality of landing pads is connected to a corresponding one of the plurality of buried contacts.

10. The semiconductor memory device of claim 9,
    wherein each of the plurality of insulating fences extends from between the corresponding pair of buried contacts among the plurality of buried contacts to between the corresponding pair of landing pads among the plurality of landing pads.

11. The semiconductor memory device of claim 1,
    wherein each of the plurality of buried contacts and each of the plurality of insulating fences are alternately arranged in the first horizontal direction.

12. A semiconductor memory device comprising:
    a substrate having a plurality of active regions defined by an element isolation layer;

a plurality of bit line structures extending in parallel with each other in a first horizontal direction on the substrate and spaced apart from each other in a second horizontal direction perpendicular to the first horizontal direction, each of the plurality of bit line structures comprising a bit line and an insulating capping line stacked on the bit line;

a plurality of first insulating spacer structures covering first sidewalls of the plurality of bit line structures;

a plurality of second insulating spacer structures covering second sidewalls of the plurality of bit line structures;

a plurality of insulating fences disposed in a first space between one of the plurality of first insulating spacer structures and one of the plurality of second insulating spacer structures adjacent thereto in the second horizontal direction and spaced apart from each other in the first horizontal direction;

a plurality of buried contacts disposed in the first space and spaced apart from each other in the first horizontal direction, each of the plurality of buried contacts filling a lower portion of the first space and being connected to a corresponding one of the plurality of active regions, wherein each of the plurality of buried contacts and each of the plurality of insulating fences are alternately arranged in the first horizontal direction; and a plurality of landing pads spaced apart from each other in the first horizontal direction, each of the plurality of landing pads connected to a corresponding one of the plurality of buried contacts, each of the plurality of landing pads filling an upper portion of the first space and extending to an upper portion of a corresponding one of the plurality of bit line structures, wherein each of the plurality of insulating fences extends from between a corresponding pair of buried contacts among the plurality of buried contacts to between a corresponding pair of landing pads among the plurality of landing pads, wherein each of the plurality of insulating fences between the corresponding pair of buried contacts among the plurality of buried contacts includes a lower portion and an upper portion which are connected with each other at a height of a bottommost surface of the corresponding pair of landing pads, wherein a first width of an uppermost surface of the lower portion is different from a second width of a lowermost surface of the upper portion, and the first and second widths are measured in the first horizontal direction, and wherein the bottommost surface of the upper portion is connected to the uppermost surface of the lower portion at the same level to constitute a stepped surface.

13. The semiconductor memory device of claim 12, further comprising:

an expansion capping layer on the insulating capping line, wherein an upper portion of the insulating capping line of each of the plurality of bit line structures protrudes from between a corresponding one of the plurality of first insulating spacer structures and a corresponding one of the plurality of second insulating spacer structures, adjacent to each other, wherein the expansion capping layer covers the upper portion of the insulating capping line, and wherein each of the plurality of landing pads contacts a top surface of the expansion capping layer.

14. The semiconductor memory device of claim 13, wherein the expansion capping layer has a first portion covering a top surface of the upper portion of the insulating capping line and a second portion covering a side surface of the upper portion of the insulating capping line, a third width of the first portion less than a second width of the second portion.

15. The semiconductor memory device of claim 12, wherein the second width of each of the plurality of insulating fences is greater than the first width of each of the plurality of insulating fences.

16. The semiconductor memory device of claim 12, wherein the first width of each of the plurality of insulating fences is greater than the second width of each of the plurality of insulating fences.

17. The semiconductor memory device of claim 16, wherein each of the plurality of insulating fences comprises an air gap therein, the air gap being disposed between two adjacent buried contacts of the plurality of buried contacts, and wherein an uppermost end of the air gap is lower than the bottommost surface of the corresponding pair of landing pads.

18. A semiconductor memory device comprising:

a substrate having a plurality of active regions defined by an element isolation layer;

a plurality of bit line structures extending in parallel with each other in a first horizontal direction on the substrate and spaced apart from each other in a second horizontal direction perpendicular to the first horizontal direction, each of the plurality of bit line structures comprising a bit line and an insulating capping line stacked on the bit line;

a plurality of first insulating spacer structures covering first sidewalls of the plurality of bit line structures;

a plurality of second insulating spacer structures covering second sidewalls of the plurality of bit line structures;

a plurality of insulating fences disposed in a first space between one of the plurality of first insulating spacer structures and one of the plurality of second insulating spacer structures adjacent thereto in the second horizontal direction and spaced apart from each other in the first horizontal direction;

a plurality of buried contacts disposed in the first space and spaced apart from each other in the first horizontal direction, each of the plurality of buried contacts filling a lower portion of the first space and being connected to a corresponding one of the plurality of active regions, wherein each of the plurality of buried contacts and each of the plurality of insulating fences are alternately arranged in the first horizontal direction;

a plurality of landing pads spaced apart from each other in the first horizontal direction, each of the plurality of landing pads connected to a corresponding one of the plurality of buried contacts, each of the plurality of landing pads filling an upper portion of the first space and extending to an upper portion of a corresponding one of the plurality of bit line structures; and a plurality of capacitor structures on the plurality of landing pads, the plurality of capacitor structures comprising a plurality of bottom electrodes, a top electrode, and a capacitor dielectric layer between the plurality of bottom electrodes and the top electrode, wherein each of the plurality of bottom electrodes is electrically connected to a corresponding one of the plurality of landing pads, wherein each of the plurality of insulating fences extends from between a corresponding pair of buried contacts among the plurality of buried contacts to between a corresponding pair of landing pads among the plurality of landing pads, wherein each of the plurality of insulating fences between the corresponding pair of buried contacts among the plurality of buried contacts includes a lower portion and an upper portion which are connected with each other at a height of a bottommost surface of the corresponding pair of landing pads, wherein a first width of an uppermost surface of the lower portion is different from a second width of a lowermost surface of the upper portion, and the first and second widths are measured in the first horizontal direction, and wherein the bottommost surface of the upper portion is connected to the uppermost surface of the lower portion at the same level to constitute a stepped surface.

19. The semiconductor memory device of claim 18, wherein the second width of each of the plurality of insulating fences is greater than the first width thereof by about 1 nm to about 5 nm.

20. The semiconductor memory device of claim 18, wherein the first width of each of the plurality of insulating fences is greater than the second width thereof by about 1 nm to about 5 nm.

* * * * *